(12) United States Patent
Tateiwa et al.

(10) Patent No.: US 8,994,193 B2
(45) Date of Patent: Mar. 31, 2015

(54) SEMICONDUCTOR PACKAGE INCLUDING A METAL PLATE, SEMICONDUCTOR CHIP, AND WIRING STRUCTURE, SEMICONDUCTOR APPARATUS AND METHOD FOR MANUFACTURING SEMICONDUCTOR PACKAGE

(71) Applicant: Shinko Electric Industries Co., Ltd., Nagano-shi, Nagano (JP)

(72) Inventors: Akihiko Tateiwa, Nagano (JP); Masato Tanaka, Nagano (JP); Akio Rokugawa, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 0 days.

(21) Appl. No.: 13/833,036

(22) Filed: Mar. 15, 2013

(65) Prior Publication Data

US 2013/0249075 A1    Sep. 26, 2013

(30) Foreign Application Priority Data

Mar. 21, 2012  (JP) .................................. 2012-063947

(51) Int. Cl.
*H01L 23/48*  (2006.01)
*H01L 23/52*  (2006.01)
(Continued)

(52) U.S. Cl.
CPC .............. *H01L 23/562* (2013.01); *H01L 21/50* (2013.01); *H05K 1/185* (2013.01); *H05K 3/4682* (2013.01); *H01L 24/24* (2013.01); *H01L 24/82* (2013.01); *H05K 2203/1469* (2013.01);
(Continued)

(58) Field of Classification Search
USPC ......... 257/690, 734, 685, 686, 723, 730, 731, 257/733, 712, 774, 777, 778, 782, 783, 784, 257/786, 787; 438/121, 109, 107, 110, 108, 438/118, 629, 637, 639, 640, 667, 668, 672, 438/675, 700, 701, 713, 978
See application file for complete search history.

(56) References Cited

U.S. PATENT DOCUMENTS

2001/0010627 A1 *  8/2001  Akagawa ...................... 361/761
2005/0218502 A1 * 10/2005  Sunohara et al. ............. 257/700
(Continued)

FOREIGN PATENT DOCUMENTS

JP    2008-300854    12/2008
JP    2011-119502    6/2011

*Primary Examiner* — A. Sefer
*Assistant Examiner* — Dilinh Nguyen
(74) *Attorney, Agent, or Firm* — Rankin, Hill & Clark LLP

(57) ABSTRACT

A semiconductor package includes: a metal plate including a first surface, a second surface and a side surface; a semiconductor chip on the first surface of the metal plate, the semiconductor chip comprising a first surface, a second surface and a side surface; a first insulating layer that covers the second surface of the metal plate; a second insulating layer that covers the first surface of the metal plate, and the first surface and the side surface of the semiconductor chip; and a wiring structure on the second insulating layer and including: a wiring layer electrically connected to the semiconductor chip; and an interlayer insulating layer on the wiring layer. A thickness of the metal plate is thinner than that of the semiconductor chip, and the side surface of the metal plate is covered by the first insulating layer or the second insulating layer.

11 Claims, 16 Drawing Sheets

(51) Int. Cl.
*H01L 29/40* (2006.01)
*H01L 23/12* (2006.01)
*H01L 21/44* (2006.01)
*H01L 21/48* (2006.01)
*H01L 21/50* (2006.01)
*H01L 21/4763* (2006.01)
*H01L 23/00* (2006.01)
*H05K 1/18* (2006.01)
*H05K 3/46* (2006.01)
*H01L 25/065* (2006.01)
*H01L 25/10* (2006.01)

(52) U.S. Cl.
CPC ............ *H01L 2224/48091* (2013.01); *H01L 2224/48227* (2013.01); *H01L 2224/73204* (2013.01); *H01L 25/0657* (2013.01); *H01L 25/105* (2013.01); *H01L 2224/04105* (2013.01); *H01L 2224/16225* (2013.01); *H01L 2224/24137* (2013.01); *H01L 2224/24246* (2013.01); *H01L 2224/32145* (2013.01); *H01L 2224/32225* (2013.01); *H01L 2224/32245* (2013.01); *H01L 2224/73265* (2013.01); *H01L 2224/73267* (2013.01); *H01L 2224/92244* (2013.01); *H01L 2225/0651* (2013.01); *H01L 2225/06517* (2013.01); *H01L 2225/1035* (2013.01); *H01L 2225/1058* (2013.01); *H01L 2924/15311* (2013.01); *H01L 2924/18162* (2013.01); *H01L 2225/06558* (2013.01)
USPC ............ 257/778; 257/733; 257/734; 257/774; 257/786; 438/121; 438/108; 438/637; 438/667

(56) References Cited

U.S. PATENT DOCUMENTS

2008/0258300 A1* 10/2008 Kobayashi et al. ............ 257/737
2012/0328853 A1* 12/2012 Matsuyama et al. ....... 428/195.1

* cited by examiner

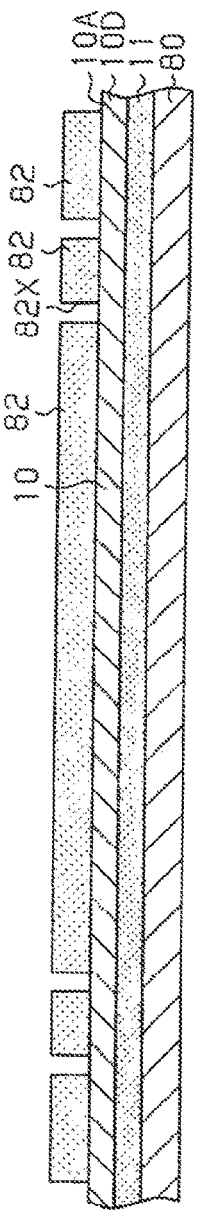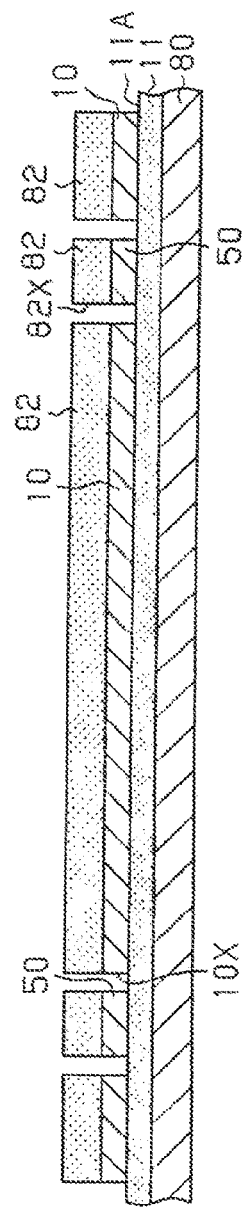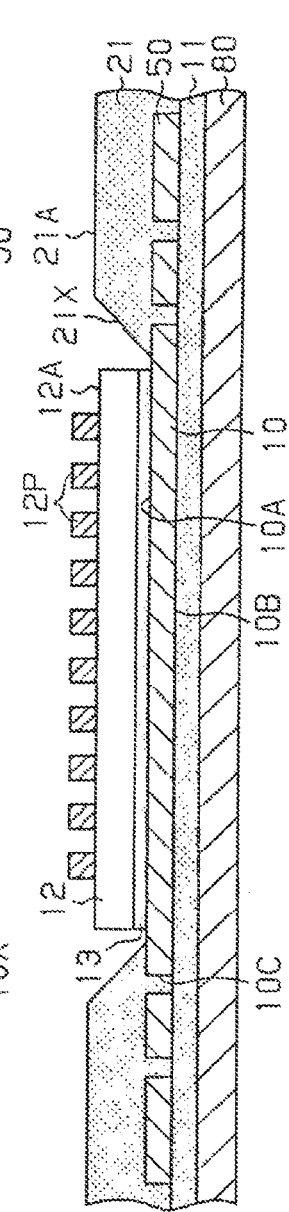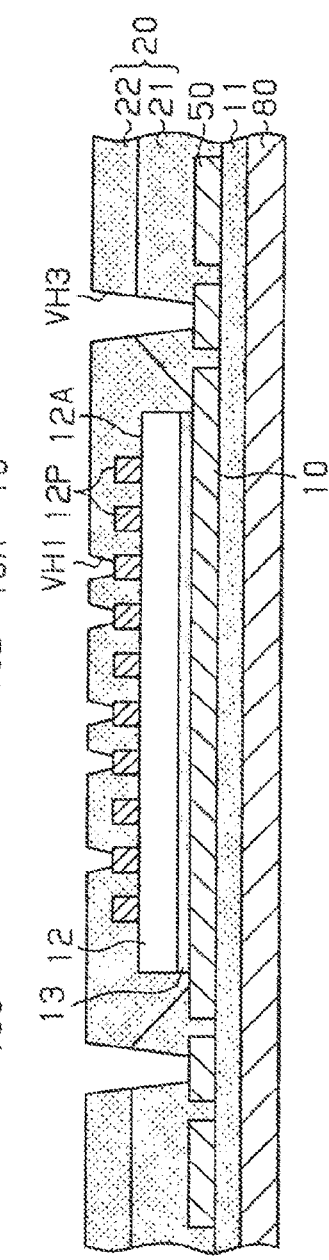
FIG. 7A
FIG. 7B
FIG. 7C
FIG. 7D

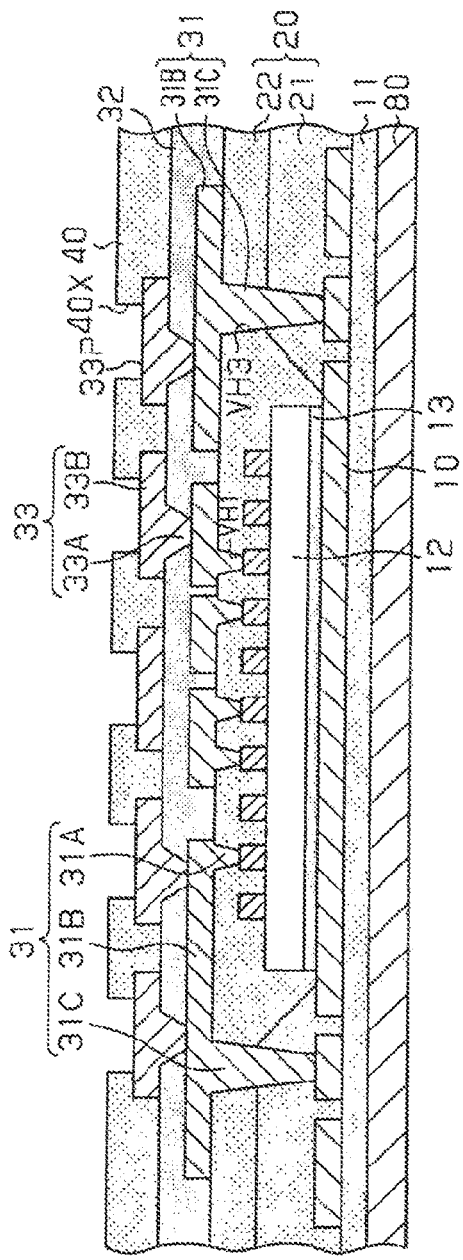
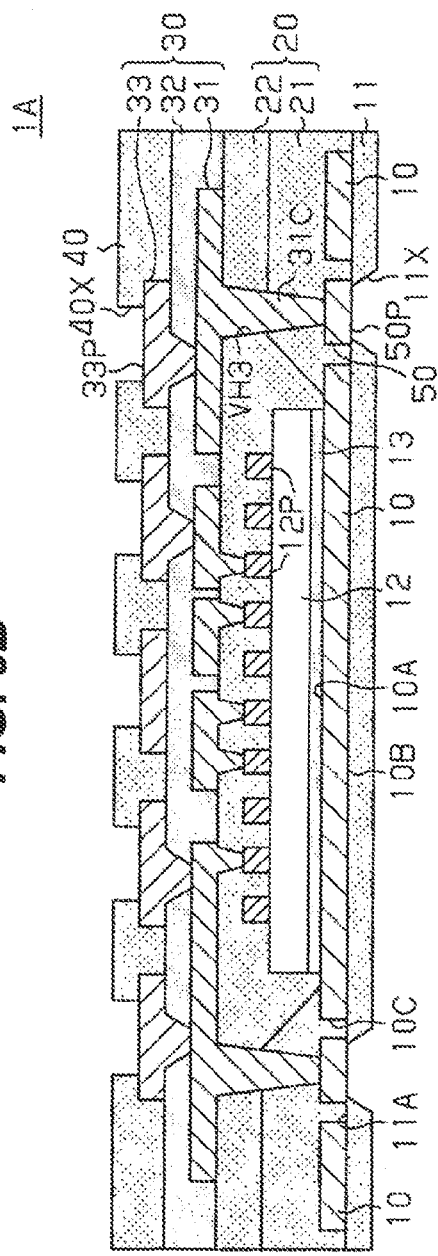

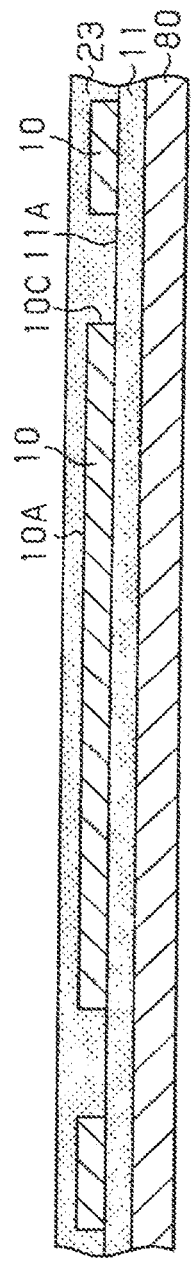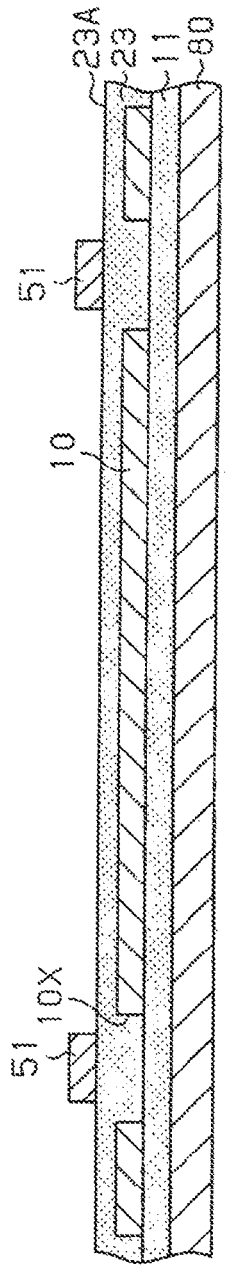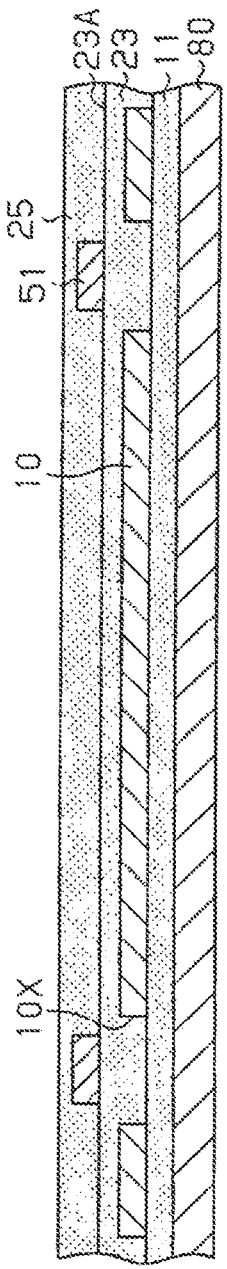
FIG. 12A
FIG. 12B
FIG. 12C

SEMICONDUCTOR PACKAGE INCLUDING A METAL PLATE, SEMICONDUCTOR CHIP, AND WIRING STRUCTURE, SEMICONDUCTOR APPARATUS AND METHOD FOR MANUFACTURING SEMICONDUCTOR PACKAGE

This application claims priority from Japanese Patent Application No. 2012-063947, filed on Mar. 21, 2012, the entire contents of which are herein incorporated by reference.

BACKGROUND

1. Technical Field

The present disclosure relates to a semiconductor package, a semiconductor apparatus and a method for manufacturing the semiconductor package.

2. Description of the Related Art

In the related art, a semiconductor package including a semiconductor chip and a resin layer that covers the semiconductor chip has been used.

As an example of such a semiconductor package, a structure has been proposed in which an active surface (circuit forming surface) and a side surface of a semiconductor chip are covered by an insulating layer and a wiring structure electrically connected to the semiconductor chip is formed on the insulating layer (for example, see JP-A-2011-119502 and JP-A-2008-300854).

As a method for manufacturing such a semiconductor package, the following method has been proposed.

For example, a support substrate is prepared, and a semiconductor chip is mounted on the support substrate such that a surface of the semiconductor chip opposite to an active surface thereof is in contact with a front surface of the support substrate. Then, the mounted semiconductor chip is encapsulated by an insulating layer, and a wiring layer and an interlayer insulating layer are formed on the insulating layer to form a wiring structure. Then, the support substrate is removed. The semiconductor package is thus manufactured.

In the related-art manufacturing process of the semiconductor package, in a state where the semiconductor chip is fixed on the support substrate and the insulating layer and the wiring structure are formed, stiffness of the support substrate is high, and thus, warpage hardly occurs in the semiconductor package. However, if the support substrate is removed, stress in a portion where the support substrate is removed is released. Thus, warpage occurs in the semiconductor package due to the stress release.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages described above.

According to one or more illustrative aspects of the present invention, there is provided a semiconductor package. The semiconductor package includes: a metal plate comprising a first surface, a second surface opposite to the first surface and a side surface between the first surface and the second surface; a semiconductor chip on the first surface of the metal plate, the semiconductor chip comprising a first surface, a second surface opposite to the first surface and a side surface between the first surface and the second surface; a first insulating layer that covers the second surface of the metal plate; a second insulating layer that covers the first surface of the metal plate, and the first surface and the side surface of the semiconductor chip; and a wiring structure on the second insulating layer and comprising: a wiring layer electrically connected to the semiconductor chip; and an interlayer insulating layer on the wiring layer. A thickness of the metal plate is thinner than that of the semiconductor chip. The side surface of the metal plate is covered by the first insulating layer or the second insulating layer.

According to one or more illustrative aspects of the present invention, there is provided a method for manufacturing a semiconductor package. The method includes: (a) forming a first insulating layer on a support substrate; (b) forming a metal plate on the first insulating layer, wherein an external dimension of the metal plate is smaller than that of the first insulating layer; (c) bonding a semiconductor chip onto a first surface of the metal plate and forming a second insulating layer to cover the metal plate and the semiconductor chip; (d) forming a wiring structure on the second insulating layer, wherein the wiring structure comprises: a wiring layer electrically connected to the semiconductor chip; and an interlayer insulating layer on the wiring layer; (e) removing the support substrate, wherein a thickness of the metal plate is thinner than that of the semiconductor chip.

According to the aspect of the invention, it is possible to reduce warpage.

Other aspects and advantages of the present invention will be apparent from the following description, the drawings and the claims.

BRIEF DESCRIPTION OF THE DRAWINGS

FIG. 1A shows a cross-sectional view of the semiconductor package which is taken along line A-A in FIG. 1B;

FIG. 5A shows a cross-sectional view of the semiconductor package which is taken along line B-B in FIG. 5B;

FIGS. 7A to 7D are cross-sectional views schematically illustrating the method for manufacturing the semiconductor package according to the second embodiment;

FIGS. 8A and 8B are cross-sectional views schematically illustrating the method for manufacturing the semiconductor package according to the second embodiment;

FIG. 11B is a plan view schematically illustrating the semiconductor package in a manufacturing process shown in FIG. 11A, when viewed from an upper surface side, wherein FIG. 11A shows a cross-sectional view of the semiconductor package which is taken along line C-C in FIG. 11B;

FIGS. 12A to 12C are cross-sectional views schematically illustrating the method for manufacturing the semiconductor package according to the third embodiment;

DETAILED DESCRIPTION OF EXEMPLARY EMBODIMENTS

Figure 1A:
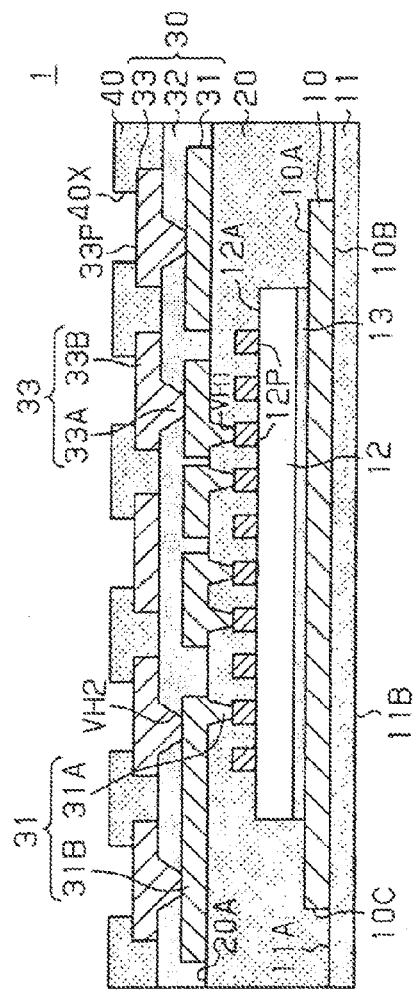
FIG. 1A is a cross-sectional view schematically illustrating a semiconductor package according to a first embodiment.

Hereinafter, exemplary embodiments of the present invention will be described with reference to the accompanying drawings. In all the drawings for the explanation of the embodiments, the members having the same functions are represented by the same reference numerals, and repeated description thereof will be omitted.

Also, in the drawings, characteristic portions may be enlarged for the convenience of illustration for easy understanding of the characteristics, and the scale of respective components or the like may not be the same as an actual scale. Further, in the cross-sectional views, hatching of some members is omitted for easy understanding of cross-sectional structures of the respective members.

First Embodiment

Hereinafter, a first embodiment will be described referring to FIGS. 1A and 1B to FIGS. 4A to 4D.
<Structure of Semiconductor Package>
As shown in FIG. 1A, a semiconductor package 1 includes a metal plate 10, a first insulating layer 11, a semiconductor chip 12, a second insulating layer 20, a wiring structure 30, and a solder resist layer 40.

Figure 1B:
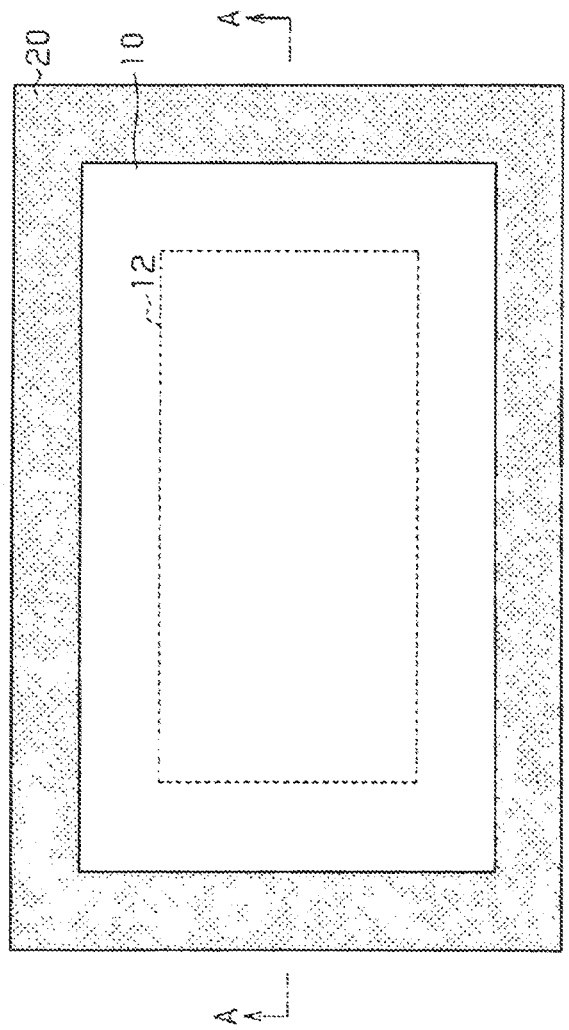
FIG. 1B is a plan view schematically illustrating the semiconductor package shown in FIG. 1A, when viewed from a lower surface side, wherein a first insulating layer 11 is not shown in FIG. 1B.

The metal plate 10 includes a first surface 10A (upper surface in FIG. 1A), a second surface 10B (lower surface in FIG. 1A) opposite to the first surface 10A, and a side surface 10C between the first surface 10A and the second surface 10B. The thickness of the metal plate 10 is set to be thinner than that of the semiconductor chip 12. Specifically, it is preferable that the thickness of the metal plate 10 be about 50 to 95% of the thickness of the semiconductor chip 12, for example, from the viewpoint of warpage reduction of the semiconductor package 1. More specifically, the thickness of the metal plate 10 may be set to about 15 to 70 μm, for example. As shown in FIG. 1B, the metal plate 10 is formed over approximately the entire surface excluding an outer edge of the semiconductor package 1 (for example, the first insulating layer 11 shown in FIG. 1A). The external dimension of the metal plate 10 is set to be smaller than the external dimension of the semiconductor package 1. Further, the external dimension of the metal plate 10 is set to be larger than the external dimension of the semiconductor chip 12. As a material of the metal plate 10, metal such as Cu, Al, Fe or Ni, or alloy that includes at least one metal thereof may be used.

As shown in FIG. 1A, the first insulating layer 11 is formed to cover the second surface 10B of the metal plate 10. That is, the metal plate 10 is formed on a first surface 11A of the first insulating layer 11 (upper surface in FIG. 1A). The first insulating layer 11 becomes the outermost insulating layer in the semiconductor package 1. That is, the first insulating layer 11 is an insulating layer in which a second surface 11B (lower surface in FIG. 1A) is exposed outside in the semiconductor package 1. The thickness of the first insulating layer 11 may be set to about 20 to 40 μm. As a material of the first insulating layer 11, for example, a thermosetting insulating resin such as an epoxy-based resin, an acryl-based resin or the like may be used. A thermal expansion coefficient of the epoxy-based resin is about 46 ppm/° C. at a temperature lower than a glass transition temperature Tg (for example, 150° C.), and is about 120 ppm/° C. at a temperature equal to or higher than the glass transition temperature Tg. The insulating resin is not limited to the thermosetting resin, and a photosensitive insulating resin may be used as the insulating resin. Further, as the material of the first insulating layer 11, for example, a ceramic material such as aluminum nitride or alumina may be used. It is preferable that the same material as that of an interlayer insulating layer 32 in the wiring structure 30 be used as the material of the first insulating layer 11 from the viewpoint of warpage reduction of the semiconductor package 1.

The semiconductor chip 12 is bonded onto the first surface 10A of the metal plate 10 through a bonding material 13. That is, the semiconductor chip 12 is thermally connected to the metal plate 10 by the bonding material 13. A logic chip such as a CPU (Central Processing Unit) chip or a GPU (Graphics Processing Unit) chip may be used as the semiconductor chip 12, for example. Further, a memory chip such as a DRAM (Dynamic Random Access Memory) chip, an SRAM (Static Random Access Memory) chip or a flash memory chip may be used as the semiconductor chip 12, for example.

The semiconductor chip 12 includes a semiconductor substrate, for example. Silicon (Si) or the like may be used as a material of the semiconductor substrate, for example. Further, in the semiconductor chip 12, a semiconductor integrated circuit (not shown) is formed on a first surface 12A (upper surface in FIG. 1A). Although not shown, the semiconductor integrated circuit includes a diffusion layer formed in the semiconductor substrate, an insulating layer formed on the semiconductor substrate, vias and wirings provided in the insulating layer, and the like. Further, on the semiconductor integrated circuit, an electrode pad (not shown) that is electrically connected to the semiconductor integrated circuit is formed, and an electrode terminal 12P is provided on the electrode pad. The electrode terminal 12P is a conductive post formed in the shape of a pillar that extends upward from the first surface 12A of the semiconductor chip 12. The height of the electrode terminal 12P may be set to about 10 to 20 μm, for example. In a case where the electrode terminal 12P is formed in the pillar shape, the diameter of the electrode terminal 12P may be set to 30 to 50 μm, for example. Copper or copper alloy may be used as a material of the electrode terminal 12P, for example.

The size of the semiconductor chip 12 may be set to about 5 mm×5 mm to 9 mm×9 mm from a planar view, for example. The thickness of the semiconductor chip 12 may be set to about 50 to 200 μm, for example. Further, in the present embodiment, the semiconductor 12 is formed of silicon, and a thermal expansion coefficient of the semiconductor chip 12 is about 3.4 ppm/° C. In the following description, the first surface 12A of the semiconductor chip 12 may be referred to as a circuit forming surface 12A.

Further, a silicone polymer-based resin or an epoxy-based resin may be used as a material of the bonding material 13, for example. The thickness of the bonding material 13 may be set to about 5 to 20 μm.

The second insulating layer 20 is formed to cover the first surface 10A and side surfaces 10C of the metal plate 10, to cover the first surface 12A and side surfaces of the semiconductor chip 12 and to cover the first surface 11A of the first insulating layer 11. The second insulating layer 20 is formed so that the first surface 20A (upper surface in FIG. 1A) on the side of the wiring structure 30 is flat. A thermosetting epoxy-based insulating resin may be used as a material of the second insulating layer 20. The insulating resin is not limited to the thermosetting resin, and a photosensitive insulating resin may be used. The thickness from the first surface 11A of the first insulating layer 11 to the first surface 20A of the second insulating layer 20 may be set to about 100 to 180 μm, for example.

A via hole VH1 that is formed through the second insulating layer 20 to expose an upper surface of the electrode terminal 12P of the semiconductor chip 12 is formed in the second insulating layer 20.

In the wiring structure 30, a wiring layer and an interlayer insulating layer are alternately formed. The wiring layer may have an arbitrary number of layers, and the interlayer insulating layer may have a layer thickness so that the respective wiring layers are insulated from each other. In an example shown in FIG. 1A, the wiring structure 30 includes a first wiring layer 31, an interlayer insulating layer 32 and a second wiring layer 33. In this way, the semiconductor package 1 of the present embodiment has a "coreless structure" type that does not include a support substrate, differently from a semiconductor package manufactured (obtained by sequentially forming a predetermined number of build-up layers on both surfaces or a single surface of a core substrate that is a support substrate) using a general build-up process.

The first wiring layer 31 is formed on the second insulating layer 20. The first wiring layer 31 includes a via wiring 31A filled in the via hole VH1, and a wiring pattern 31B formed on the second insulating layer 20. The via wiring 31A is electrically connected to the electrode terminal 12P that is exposed at the bottom of the via hole VH1, and is electrically connected to the wiring pattern 31B. The via hole VH1 and the via wiring 31A are formed in a tapered shape in which the diameter is increased from the lower side (the side of the semiconductor chip 12) toward the upper side (the side of the second wiring layer 33) in FIG. 1A. Further, the planar shapes of the via hole VH1 and the via wiring 31A are circular, for example. The diameters of the via hole VH1 and the via wiring 31A may be set to about 20 to 40 μm, for example. The thickness of the wiring pattern 31B may be set to about 15 to 35 μm, for example. Copper or copper alloy may be used as a material of the first wiring layer 31, for example.

The interlayer insulating layer 32 is the outermost interlayer insulating layer (specifically, the outermost interlayer insulating layer positioned on the opposite side of the first insulating layer 11) formed on the second insulating layer 20 to cover the first wiring layer 31. The interlayer insulating layer 32 is an insulating layer containing a reinforcing material, and is an insulating layer having a mechanical strength (stiffness, hardness or the like) higher than those of the first and second insulating layers 11 and 20. As a material of the interlayer insulating layer 32, for example, an insulating resin containing a reinforcing material in a thermosetting resin may be used. Specifically, as the material of the interlayer insulating layer 32, for example, an insulating resin containing a reinforcing material obtained by impregnating an epoxy-based thermosetting resin or a polyimide-based thermosetting resin in woven fabric or non-woven fabric of glass, aramid or LCP (Liquid Crystal Polymer) fiber may be used. Further, it is preferable that the material of the interlayer insulating layer 32 be adjusted so that the thermal expansion coefficient of the interlayer insulating layer 32 is close to the thermal expansion coefficient of the semiconductor chip 12 compared with the thermal expansion coefficients of the first and second insulating layers 11 and 20. In other words, it is preferable that the material of the interlayer insulating layer 32 be adjusted so that the thermal expansion coefficient of the interlayer insulating layer 32 is lower than the thermal expansion coefficients of the first and second insulating layers 11 and 20. Specifically, the thermal expansion coefficient of the interlayer insulating layer 32 is set to about 18 to 30 ppm/° C., for example. The thickness from the first surface 20A of the second insulating layer 20 to the upper surface of the interlayer insulating layer 32 may be set to about 35 to 70 μm, for example. Further, the thickness from the upper surface of the wiring pattern 31B to the upper surface of the interlayer insulating layer 32 may be set to about 20 to 30 μm, for example. Further, it is preferable that the interlayer insulating layer 32 be formed to be thicker than the thickness in a case where an insulating resin without containing a reinforcing material is used as the interlayer insulating layer 32 from the viewpoint of increase in mechanical strength.

A via hole VH2 is formed through the interlayer insulating layer 32 to expose an upper surface of the wiring pattern 31B of the first wiring layer 31.

The second wiring layer 33 is the outermost wiring layer formed on the interlayer insulating layer 32. The second wiring layer 33 includes a via wiring 33A filled in the via hole VH2, and a wiring pattern 33B formed on the interlayer insulating layer 32. The via wiring 33A is electrically connected to the first wiring layer 31 that is exposed at the bottom of the via hole VH2, and is electrically connected to the wiring pattern 33B. The via hole VH2 and the via wiring 33A are formed in the tapered shape in which the diameter is increased from the lower side toward the upper side in FIG. 1A. Further, the planar shapes of the via hole VH2 and the via wiring 33A are circular, for example, and the diameters thereof may be set to about 50 to 75 μm, for example. The thickness of the wiring pattern 33B may be set to about 15 to 35 μm, for example. The wiring pattern 33B is disposed in a matrix or peripheral shape from a planar view. Copper or copper alloy may be used as a material of the second wiring layer 33, for example.

The solder resist layer 40 is formed on the interlayer insulating layer 32 to cover the second wiring layer 33. An opening portion 40X for exposing a part of the wiring pattern 33B as an external connection pad 33P is formed in the solder resist layer 40. An external connection terminal such as a solder ball or a lead pin used when the semiconductor package 1 is mounted on a mount board or the like is connected to the external connection pad 33P. As necessary, an OSP film may be formed on the wiring pattern 33B that is exposed through the opening portion 40X using an OSP (Organic Solderability Preservative) process, and the external connection terminal may be connected to the OSP film. Further, a metal layer may be connected on the wiring pattern 33B that is exposed through the opening portion 40X, and the external connection terminal may be connected to the metal layer. As an example of the metal layer, an Au layer, a Ni/Au layer (metal layer obtained by sequentially stacking a Ni layer and an Au layer), a Ni/Pd (palladium)/Au layer (metal layer obtained by sequentially stacking a Ni layer, a Pd layer and an Au layer) or the like may be used. The wiring pattern 33B that is exposed through the opening portion 40X (or the OSP film or the metal layer in a case where the OSP film or the metal layer is formed on the wiring pattern 33B) itself may be used as the external connection terminal.

The planar shape of the opening portion 40X is circular, for example, and its diameter may be set to about 200 to 300 µm. The thickness from the upper surface of the interlayer insulating layer 32 to the upper surface of the solder resist layer 40 may be set to about 20 to 40 µm, for example. As a material of the solder resist layer 40, for example, an epoxy-based or acryl-based insulating resin may be used.

The size of the semiconductor package 1 having the above-mentioned structure may be set to about 8 mm×8 mm to 12 mm×12 mm from a planar view, for example. Further, the entire thickness of the semiconductor package 1 may be set to about 300 to 700 µm, for example.

Here, the warpage of related-art the semiconductor package, that is, the warpage of a semiconductor package 5 (see FIG. 16) in which the metal plate 10 and the first insulating layer 11 are not formed and an interlayer insulating layer 32A formed of an insulating resin having the same composition as those of the first and second insulating layers 11 and 20, instead of the interlayer insulating layer 32, is formed will be described. In the semiconductor package 5, for example, the shrinkage occurring during cooling after heat treatment depends on physical properties (thermal expansion coefficient, elastic modulus and the like) of the semiconductor chip 12, that is, physical properties of silicon on the side of the semiconductor chip 12. On the other hand, on the side of the wiring structure 30 of the related semiconductor package 5, for example, the shrinkage occurring during cooling after heat treatment depends on physical properties of the wiring structure 30, that is, physical properties of the interlayer insulating layer 32A. As described above, the thermal expansion coefficient of silicon is 3.4 ppm/° C., but in a case where the epoxy-based resin is used as the interlayer insulating layer 32A, the thermal expansion coefficient is 46 ppm/° C. at a temperature lower than the glass transition temperature Tg (150° C.), and is 120 ppm/° C. at a temperature equal to or higher than the glass transition temperature Tg. As described above, in the related-art semiconductor package 5, when the semiconductor package 5 is viewed in the vertical direction (thickness direction), distribution of the physical properties (thermal expansion coefficient, elastic modulus and the like) is vertically asymmetric. Thus, there is a problem that warpage may easily occur in the semiconductor package 5.

On the other hand, in the semiconductor package 1 of the present embodiment, as shown in FIG. 1A, the metal plate 10 and the first insulating layer 11 are formed on the opposite side of the wiring structure 30 around the semiconductor chip 12. Thus, the wiring structure 30 in which the first and second wiring layers 31 and 33 and the interlayer insulating layer 32 are formed is formed on the side of the first surface 12A of the semiconductor chip 12, and the metal plate 10 and the first insulating layer 11 are formed on the opposite side of the first surface 12A. Thus, distribution of the physical properties (thermal expansion coefficient, elastic modulus and the like) when the semiconductor package 1 is viewed in the vertical direction (thickness direction) shows a state close to a vertical symmetry around the semiconductor chip 12. Accordingly, the balance of the vertical physical properties around the semiconductor chip 12 becomes favorable, and thus, it is possible to suppress the semiconductor package 1 from being warped or deformed accordance to thermal contraction or the like.

Further, since the entire surfaces including the side surfaces of the metal plate 10 are covered by the first insulating layer 11 and the second insulating layer 20, oxidation of the metal plate 10 is suppressed.

<Method for Manufacturing Semiconductor Package>

Next, a method for manufacturing the semiconductor package 1 will be now described.

Figure 2A:
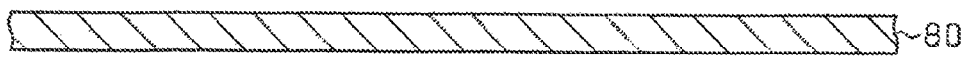
FIGS. 2A to 2F are cross-sectional views schematically illustrating a method for manufacturing the semiconductor package according to the first embodiment.

First, as shown in FIG. 2A, a support substrate 80 is prepared in order to manufacture the semiconductor package 1. The support substrate 80 is a rectangular flat plate from a planar view, for example. A metal plate or a metal foil may be used as the support substrate 80, for example. In the present embodiment, a copper plate may be used, for example. The thickness of the support substrate 80 is about 70 to 200 µm, for example. As the support substrate 80 of the present embodiment, a large-sized substrate is used on which a plurality of the semiconductor packages 1 are assembled. In FIGS. 2A to 2F and FIGS. 4A to 4D, for ease of description, a portion that corresponds to one semiconductor package 1 is shown.

Figure 2B:

Next, in a process shown in FIG. 2B, the first insulating layer 11 is formed on a first surface 80A (upper surface in the figure) of the support substrate 80 to cover the first surface 80A. For example, the first insulating layer 11 of a film shape is laminated on the first surface 80A of the support substrate 80.

Subsequently, in a process shown in FIG. 2C, a metal plate 10D that becomes the metal plate 10 is formed on the first surface 11A (upper surface in the figure) of the first insulating layer 11 to cover the first surface 11A. The metal plate 10D is formed on the first insulating layer 11 by being bonded to the first insulating layer 11 by thermo compression (heating and pressurization). Specifically, the first insulating layer 11 is heated and pressurized to be cured while the metal plate 10D is bonded to the first insulating layer 11 by thermo compression.

Figure 2C:
Figure 2D:
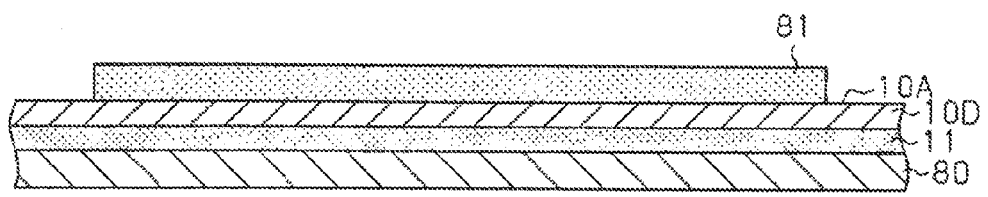

Then, in a process shown in FIG. 2D, on the first surface 10A of the metal plate 10D, a resist layer 81 is formed to cover the metal plate 10D that is a part corresponding to a region where the metal plate 10 (see FIG. 1) is formed. As a material of the resist layer 81, an etching resistant material may be used. Specifically, as the material of the resist layer 81, a photosensitive dry film resist, a liquid photoresist (for example, dry film resist or liquid resist such as a novolac-based resin or an acryl based resin) or the like may be used. For example, in a case where the photosensitive dry film resist is used, a dry film is laminated on the first surface 10A of the metal plate 10D by thermo compression bonding, and the dry film is patterned by light exposure and development to form the resist layer 81. In a case where the liquid photoresist is used, it is also possible to form the resist film 81 using the same process.

Figure 2E:
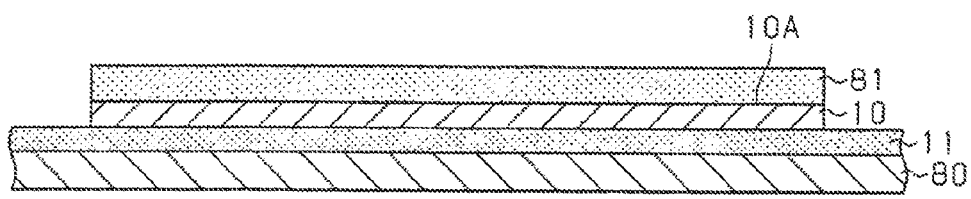

Next, by etching the metal plate 10D using the resist layer 81 as an etching mask to remove a portion of the metal plate 10D where the resist layer 81 is not formed, the metal plate 10 is formed as shown in FIG. 2E. The external dimension of the metal plate 10 is smaller than the external dimension of the first insulating layer 11 according to the above-mentioned patterning. For example, in a case where a copper plate is used as the metal plate 10D, it is possible to use a ferric chloride solution as an etchant of the present process, and it is possible to perform the patterning by performing spray etching from the side of the first surface 10A of the metal plate 10D. After patterning the metal plate 10, the resist layer 81 is removed by an alkaline remover, for example.

Figure 2F:
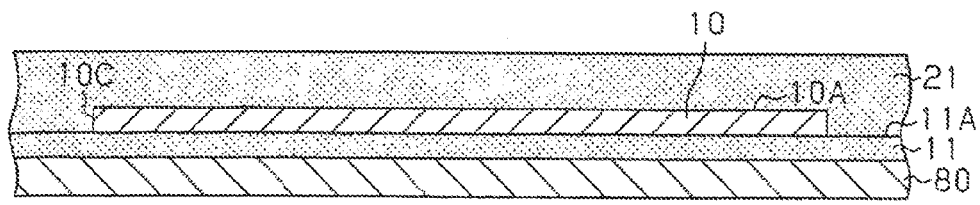

Subsequently, in a process shown in FIG. 2F, on the first surface 11A of the first insulating layer 11, an insulating layer 21 (a third insulating layer) is formed to cover the first surface 10A and the side surfaces 10C of the metal plate 10. The insulating layer 21 may be formed by laminating a resin film on the first surface 11A of the first insulating layer 11 and by performing heat treatment on the resin film at a temperature of about 130° C. to 150° C. while pressing the resin film to be cured.

Figure 3A:
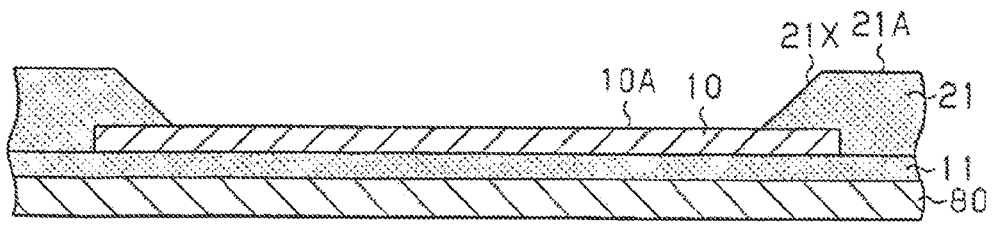
FIGS. 3A to 3D are cross-sectional views schematically illustrating a method for manufacturing the semiconductor package according to the first embodiment.

Then, in a process shown in FIG. 3A, an opening portion 21X is formed in the insulating layer 21 to expose a portion of the metal plate 10 corresponding to the mounting surface on which the semiconductor chip 12 is mounted. In the present process, the opening portion 21X is formed in a tapered shape in which the diameter is increased from the lower side (the side of the metal plate 10) toward the upper side thereof as shown in the figure. The opening portion 21X may be formed by a laser processing method using $CO_2$ laser, UV-YAG laser or the like, or a blasting process such as wet blasting.

Subsequently, in a case where the opening portion 21X is formed by the laser processing method, resin smear in the opening portion 21X is removed by a desmear process. The desmear process may be performed using permanganate, for example.

Figure 3B:
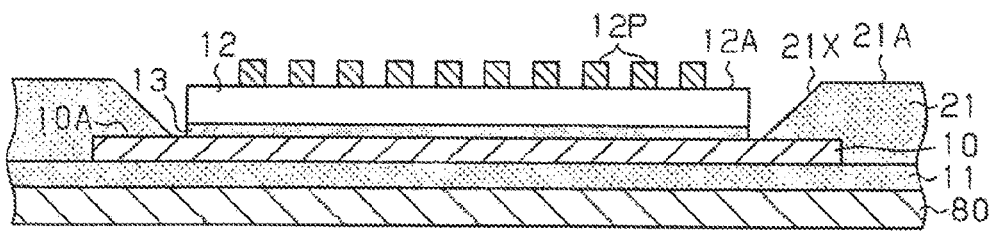

Next, in a process shown in FIG. 3B, the semiconductor chip 12 is mounted on the first surface 10A of the metal plate 10 that is exposed through the opening portion 21X. Specifically, the semiconductor chip 12 is bonded onto the first surface 10A by the bonding material 13 so that a surface opposite to the circuit forming surface 12A of the semiconductor chip 12 faces the metal plate 10, that is, in a face-up state. For example, the bonding material 13 is coated in advance on the first surface 10 of the metal plate 10, the semiconductor chip 12 that is disposed on the first surface 10A in the face-up state is heated and pressurized, and thus, the semiconductor chip 12 is bonded on the first surface 10A through the bonding material 13. Here, the insulating layer 21 formed in the previous process is formed so that the first surface (upper surface in FIG. 3B) 21A is higher than the circuit forming surface 12A of the semiconductor chip 12. That is, the insulating layer 21 formed on the first insulating layer 11 is formed to be thicker than the sum of the thickness of the metal plate 10, the thickness of the bonding material 13 and the thickness of the semiconductor chip 12. In other words, the opening portion 21X of the insulating layer 21 is formed to be deeper than the sum of the thickness of the bonding material 13 and the thickness of the semiconductor chip 12. In this way, the semiconductor chip 12 is mounted on the metal plate 10 while being accommodated in the opening portion 21X.

Subsequently, in a process shown in FIG. 3C, an insulating layer 22 (a fourth insulating layer) is formed to cover the first surface 10A of the metal plate 10, the first surface 12A and the side surfaces of the semiconductor chip 12, the electrode terminal 12P and the first surface 21A of the insulating layer 21. Thus, the second insulating layer 20 that includes the insulating layer 21 and the insulating layer 22 is formed. The thickness of the insulating layer 22 formed on the electrode terminal 12P may be set to about 15 to 25 μm. Here, the insulating layer 22 may be formed by laminating a resin film on the first surface 21A of the insulating layer 21 and by performing heat treatment for the resin film at a temperature of about 130° C. to 150° C. while pressing the resin film. Here, since the first surface 21A of the insulating layer 21 is formed to be higher than the first surface 12A of the semiconductor chip 12 as described above, it is possible to make flat the first surface (upper surface in FIG. 3C) 22A of the insulating layer 22, that is, the first surface 20A of the second insulating layer 20. Further, since the opening portion 21X of the insulating layer 21 is formed in the tapered shape where the diameter is increased from the lower side in the figure toward the upper side, it is possible to improve fluidity of the resin toward a gap between the insulating layer 21 and the semiconductor chip 12, and to suitably suppress void occurrence in the insulating layer 22. By laminating the insulating layer 22 in a vacuum atmosphere, it is possible to further suppress void occurrence in the insulating layer 22.

Figure 3C:
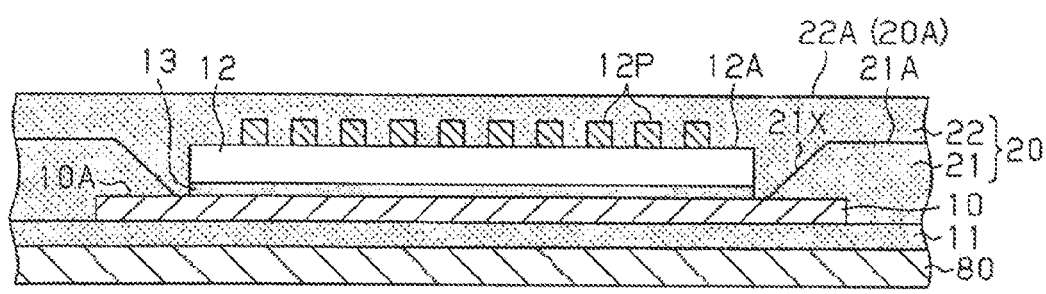
Figure 3D:
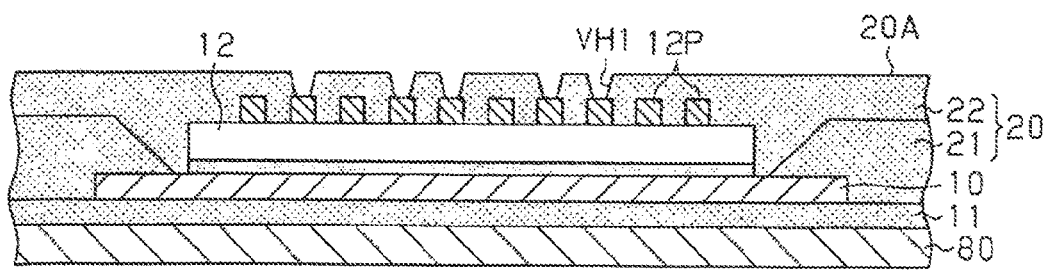

Next, in a process shown in FIG. 3D, the via holes VH1 are formed in a predetermined number of positions of the insulting layer 22 so that the upper surface of the electrode terminal 12P formed on the circuit forming surface 12A of the semiconductor chip 12 is exposed. The via hole VH1 may be formed by a laser processing method using $CO_2$ laser, UV-YAG laser or the like. In a case where the insulating layer 22 is formed using a photosensitive resin, for example, the necessary via hole VH1 may be formed by a photolithography process.

Subsequently, in a case where the via hole VH1 is formed by the laser processing method, resin smear in the via hole VH1 is removed by the desmear process. The desmear process may be performed by using permanganate, for example.

Figure 4A:
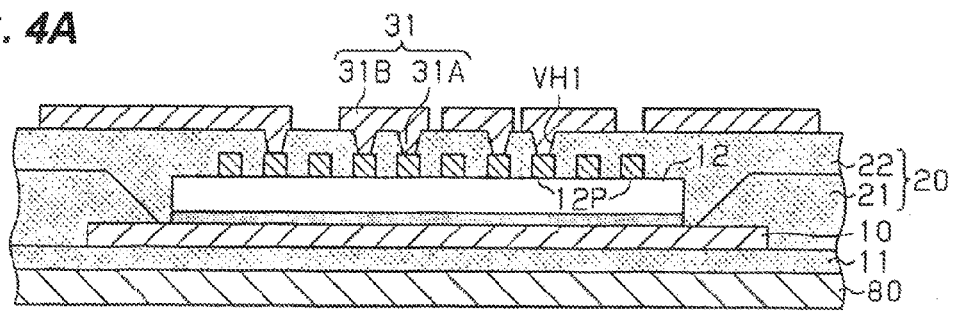
FIGS. 4A to 4D are cross-sectional views illustrating a method for manufacturing the semiconductor package according to the first embodiment.
Figure 4B:
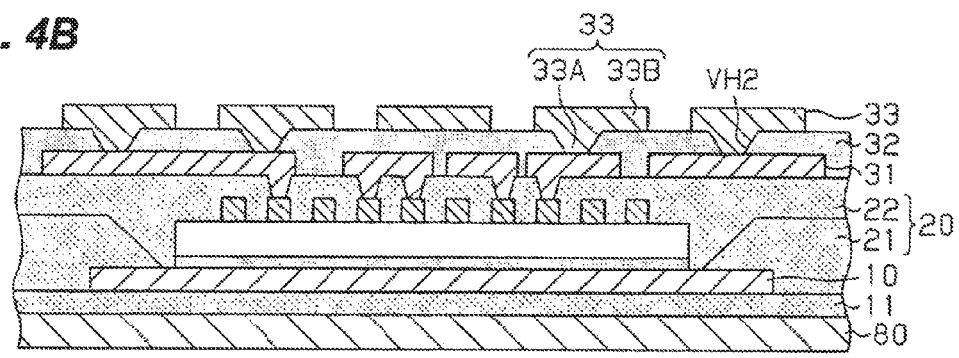

Next, in a process shown in FIG. 4A, a via conductor is filled in the via hole VH1 of the second insulating layer 20 to form the via wiring 31A, and then, the wiring pattern 31B that is electrically connected to the electrode terminal 12P through the via wiring 31A is formed on the insulating layer 22. The via wiring 31A and the wiring pattern 31B, that is, the first insulating layer 31 may be formed using various wiring forming methods such as a semi additive process or subtractive process.

Next, the interlayer insulating layer 32 and the second wiring layer 33 are alternately formed by repeatedly performing the processes shown in FIGS. 3C to 4A. Specifically, as shown in FIG. 4B, the interlayer insulating layer 32 is formed on the insulating layer 22 and the first wiring layer 31, and the via hole VH2 that reaches the upper surface of the wiring pattern 31B is formed in the interlayer insulating layer 32. Then, the via wiring 33A is formed in the via hole VH2, and the wiring pattern 33B that is electrically connected to the via wiring 33A is formed.

Figure 4C:
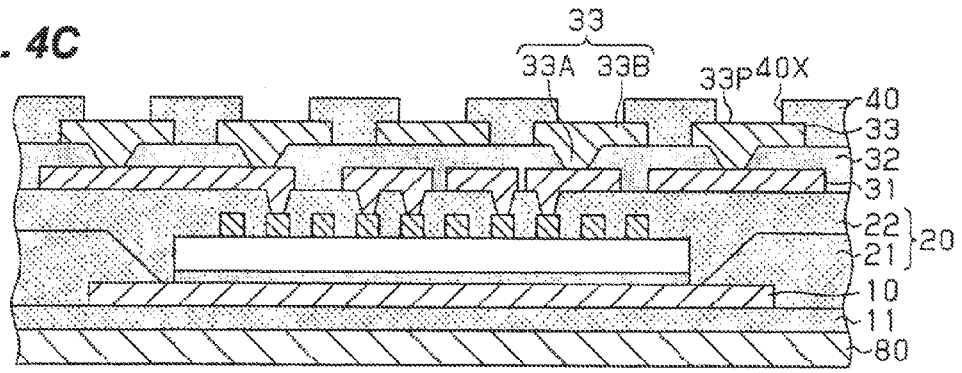

Subsequently, in a process shown in FIG. 4C, the solder resist layer 40 having an opening portion 40X is formed on the interlayer insulating layer 32 and the second wiring layer 33. The solder resist layer 40 may be formed by laminating a photosensitive solder resist film or coating a liquid solder resist and by patterning the resist in a predetermined shape, for example. Thus, a part of the wiring pattern 33B is exposed through the opening portion 40X of the solder resist layer 40 as an external connection pad 33P. A metal layer obtained by sequentially stacking an Ni layer and an Au layer may be formed on the external connection pad 33P, for example. The metal layer may be formed by an electroless plating process, for example.

Figure 4D:
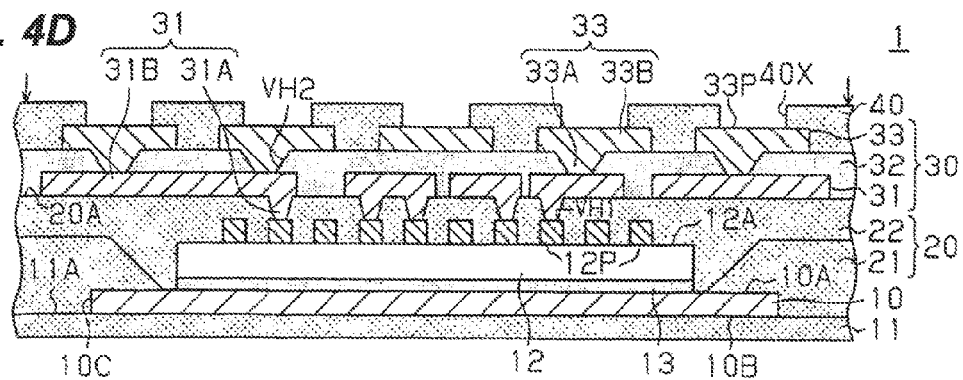

Then, in a process shown in FIG. 4D, the support substrate 80 (see FIG. 4C) used as a temporary substrate is removed. Thus, it is possible to manufacture the semiconductor package 1 of the present embodiment. For example, in a case where a copper plate is used as the support substrate 80, it is possible to remove the support substrate 80 by wet etching using a ferric chloride solution, a cupric chloride solution, an ammonium persulphate solution or the like. At this time, since the first insulating layer 11 is exposed at the side of the lower surface of the semiconductor package 1, it is possible to selectively etch only the support substrate 80 that is made of the copper plate. Here, in a case where the second wiring layer 33 is a copper layer, in order to prevent the second wiring layer 33 exposed at the bottom of the opening portion 40X from being etched together with the support substrate 80, it is necessary to perform the wet etching while masking the second wiring layer 33.

Then, by cutting a structure body shown in FIG. 4D in regions (indicated by arrows in the figure) corresponding to the individual semiconductor package 1, it is possible to obtain the semiconductor package 1 shown in FIGS. 1A and 1B.

<Modeling Effect>

Next, a calculation result of the amount of warpage of the semiconductor package 1 in a case where the thickness of the metal plate 10 is changed will be now described. Specifically, a model is assumed in which the planar shape of the semiconductor package 1 is set to 8 mm×8 mm, the planar shape of the semiconductor chip 12 is set to 5 mm×5 mm, the thickness is 100 μm (the thickness of the bonding layer 13 is 10 μm, the thickness of the semiconductor chip 12 is 75 μm, and the thickness of the post 12P is 15 μm), and the metal plate 10 and the first insulating layer 11 are provided on the lower surface of the semiconductor chip 12. In this model, it is assumed that the thickness of the first insulating layer 11 is 25 μm, the thickness from the first surface 21A of the insulating layer 21 to the first surface 20A of the second insulating layer 20 is 125 μm (the thickness from the first surface 10A of the metal plate 10 to the first surface 21A of the insulating layer 21 is 95 μm, and the thickness from the first surface 10A of the metal plate 10 to the first surface 22A of the insulating layer 22 is 30 μm). Further, in the above-mentioned model, it is assumed that the thicknesses of the wiring patterns 31B and 33B are respectively 15 μm, the thickness of the interlayer insulating layer 32 is 30 μm, the physical properties of the metal plate 10 and the wiring patterns 31B and 33B are the same, and the physical properties of the first insulating layer 11 and the second insulating layer 20 are the same. Further, the amount of warpage in a case where the physical properties of the metal plate 10, the semiconductor chip 12, the first and second insulating layers 11 and 20 and the wiring structure 30 have fixed values and the thickness of the metal plate 10 is changed, was calculated. An example of the calculated amount of warpage is shown in Table 1.

TABLE 1

| Thickness of metal plate 10 (μm) | Amount of warpage (μm) |
|---|---|
| 18 | 178 |
| 35 | 124 |
| 70 | 144 |

As can be seen from Table 1, in a case where the thickness of the metal plate 10 is 35 μm, it is possible to minimize the amount of warpage of the semiconductor package 1. The reason may be considered as follows.

In the above-mentioned model, the sum of the thicknesses of the wiring layers (wiring patterns 31B and 33B) formed as a layer higher than the circuit forming surface 12A of the semiconductor chip 12 is 30 (=15+15) μm. On the other hand, as the thickness of the metal plate 10 formed as a layer lower than the surface opposite to the circuit forming surface 12A of the semiconductor chip 12 is set to 35 μm, distribution of the physical properties around the semiconductor chip 12 when the semiconductor package 1 is vertically seen may be closest to vertical symmetry, among the calculated three values. Thus, it is considered that the amount of warpage may be minimized in a case where the thickness of the metal plate 10 is 35 μm. From the above result and observation, it is considered that it is possible to effectively reduce the warpage of the semiconductor package 1 by making the thickness of the metal plate 10 close to the sum of the thicknesses of the entire wiring layers (here, wiring patterns 31B and 33B) in the wiring structure 30.

According to the present embodiment described above, it is possible to obtain the following effects.

(1) The metal plate 10 and the first insulating layer 11 are formed on the opposite side of the wiring structure 30 around the semiconductor chip 12. Thus, the distribution of the thermal expansion coefficient and elastic ratio when the semiconductor package 1 is vertically seen shows a state close to a vertical symmetry around the semiconductor chip 12. Accordingly, balance of the vertical thermal expansion coefficient and elastic ratio around the semiconductor chip 12 becomes favorable, and thus, it is possible to reduce warpage of the semiconductor package 1 occurring according to thermal contraction or the like.

In this regard, instead of the metal plate 10 and the first insulating layer 11, a metal plate having a thickness of about 0.5 to 1 mm may be provided on the lower surface of the semiconductor chip 12 to increase the mechanical strength of the entire semiconductor package, and thus, it is possible to reduce the warpage of the semiconductor package. However, in this case, there is a new problem that thinning of the semiconductor package 1 is obstructed due to the thick metal plate. In this regard, in the semiconductor package 1 of the present embodiment, since the metal plate 10 thinner than the semiconductor chip 12 is employed, it is possible to reduce the warpage of the semiconductor package 1 and to suppress the semiconductor package 1 from being increased in size.

For example, in a case where the total thickness of the wiring layers in the wiring structure 30 is thicker than the semiconductor chip 12, the symmetry of the distribution of the physical properties around the semiconductor chip 12 deteriorates. However, by providing the metal plate 10 and the first insulating layer 11, the distribution of the physical properties around the semiconductor chip 12 may be close to the vertical symmetry, compared with a case where they are not provided, and thus, it is possible to reduce the warpage of the semiconductor package 1.

(2) Since the metal plate 10 is covered by the insulating layer 11 and the second insulating layer 20, oxidation of the metal plate 10 is suppressed. Thus, it is possible to suitably suppress the problem that thermal conductivity is reduced due to the oxidation of the metal plate 10.

(3) The thermal expansion coefficient of the outermost interlayer insulating layer 32 is set to be close to the thermal expansion coefficient of the semiconductor chip 12, compared with the thermal expansion coefficients of the first and second interlayer insulating layers 11 and 20. Thus, for example, the shrinkage occurring on the layer side (on the side of the wiring structure 30) higher than the semiconductor chip 12 during cooling after heat treatment may be close to the shrinkage occurring on the side of the semiconductor chip 12 (the semiconductor chip 12, the metal plate 10 and the first insulating layer 11). Accordingly, it is possible to reduce the warpage occurring in the semiconductor package 1.

(4) The semiconductor chip 12 is bonded onto the metal plate 10 through the bonding material 13. Thus, the semiconductor chip 12 is thermally connected to the metal plate 10, and thus, it is possible to efficiently radiate heat generated in the semiconductor chip 12.

(5) The insulating layer 21 is formed so that the first surface 21A of the insulating layer 21 is higher than the circuit forming surface 12A of the semiconductor chip 12. Thus, it is possible to make flat the first surface 22A of the insulating layer 22 that is formed on the first surface 21A of the insulating layer 21 and covers the circuit forming surface 12A of the semiconductor chip 12.

(6) The opening portion 21X of the insulating layer 21 is formed in a tapered shape where the diameter is increased from the lower side (the side of the metal plate 10) toward the upper side thereof. Thus, when the insulating layer 22 is formed on the insulating layer 21, fluidity of the resin toward the gap between the insulating layer 21 and the semiconductor chip 12 is improved, and thus, it is possible to appropriately suppress void occurrence in the insulating layer 22.

Second Embodiment

Hereinafter, a second embodiment will be now described with reference to FIGS. 5A and 5B to FIG. 9. A semiconductor package 1A according to this embodiment is different from the first embodiment in that a connection pad 50P connected to a first wiring layer 31 is formed on the same plane as a metal plate 10. Hereinafter, different points from the first embodiment will be mainly described. The same reference numerals are given to the same members as the members shown in FIGS. 1A and 1B to FIGS. 4A to 4D, and detailed description thereof will be omitted.

Figure 5A:
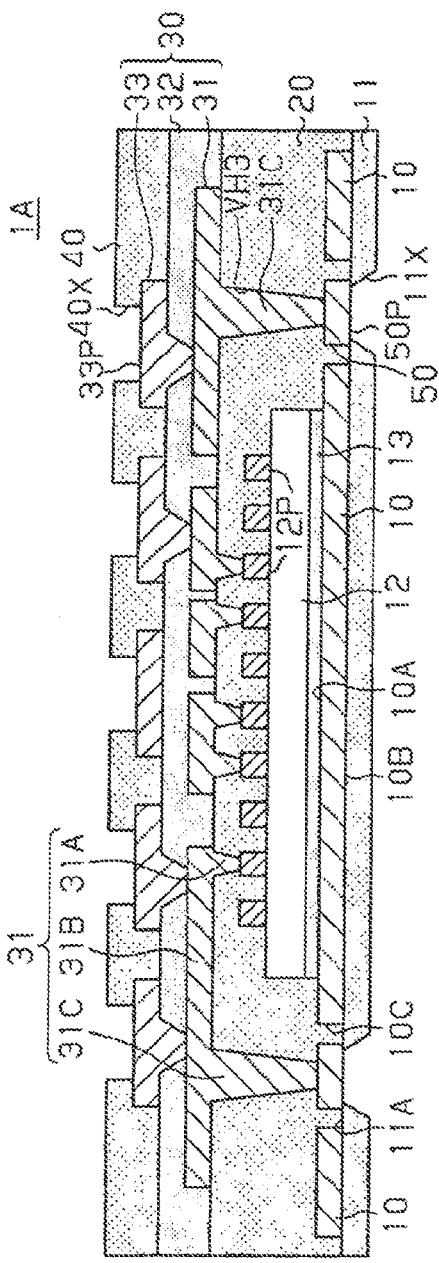
FIG. 5A is a cross-sectional view schematically illustrating a semiconductor package according to a second embodiment.
Figure 5B:
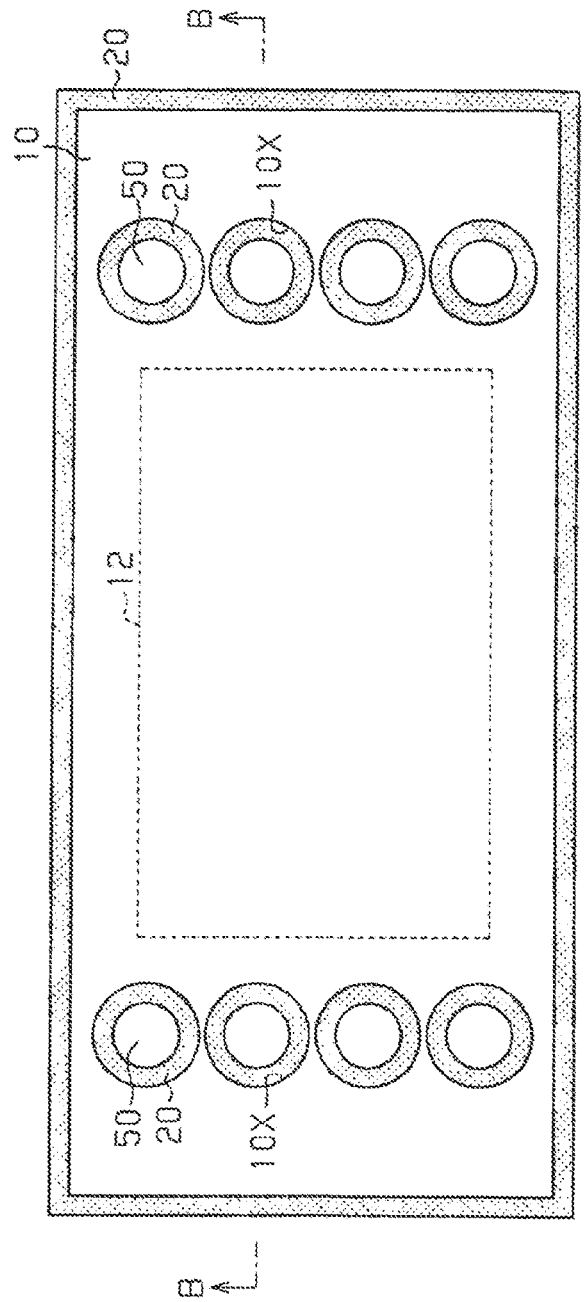
FIG. 5B is a plan view schematically illustrating the semiconductor package shown in FIG. 5A, when viewed from a lower surface side, wherein a first insulating layer 11 is not shown in FIG. 5B.

As shown in FIG. 5A, on a first surface 11A of a first insulating layer 11, a metal plate 10 is formed, and a conductive layer 50 that is electrically separated from the metal plate 10 is also formed. As shown in FIG. 5B, the metal plate 10 is formed over approximately the entire surface excluding an outer edge of the semiconductor package 1A (for example, the first insulating layer 11 shown in FIG. 5A), and is formed to extend around the periphery of the conductive layer 50. Specifically, in the metal plate 10, an approximately circular opening portion 10X, from a planar view, having a planar shape larger than the conductive layer 50 is formed in a region where the conductive layer 50 is formed. Further, the conductive layer 50 having an approximately circular shape from a planar view is formed in the opening portion 10X. Thus, a second insulating layer 20 is exposed in an annular shape from the metal plate 10 and the conductive layer 50, between the metal plate 10 and the conductive layer 50.

Further, as shown in FIG. 5A, an opening portion 11X for exposing a part of the conductive layer 50 as a connection pad 50P is formed in the first insulating layer 11. The connection pad 50P is electrically connected to a different semiconductor package 4 (see FIG. 6) or the like. The planar shapes of the opening portion 11X and the connection pad 50P are circular, for example, and their diameters may be set to about 100 to 200 μm, for example. The opening portion 11X and the connection pad 50P are formed in an annular shape along the periphery of a semiconductor chip 12, in a so-called peripheral shape.

As the conductive layer 50, for example, a layer obtained by stacking a Cu layer or the like on a metal layer obtained by sequentially stacking an Au layer and a Ni layer from the side of the surface exposed from the first insulating layer 11 toward the side of a wiring structure 30 may be used. In this case, the thickness of the Au layer may be set to about 0.1 to 1 μm, for example, the thickness of the Ni layer may be set to about 1 to 10 μm, for example, and thickness of the Cu layer may be set to about 10 to 40 μm, for example.

A via hole VH1 is formed, and a via hole VH3 is formed through the second insulating layer 20 to expose an upper surface of the conductive layer 50.

A first wiring layer 31 includes a via wiring 31A filled in the via hole VH1, a via wiring 31C filled in the via hole VH3, and a wiring pattern 31B formed on the second insulating layer 20. The via wiring 31C is electrically connected to the conductive layer 50 that is exposed at the bottom of the via hole VH3, and is electrically connected to the wiring pattern 31B. The via hole VH3 and the via wiring 31C are formed in the tapered shape where the diameter is increased from the lower side (the side of the insulating layer 11) toward the upper side (the side of the second insulating layer 33) in FIG. 5A. Further, the planar shapes of the via hole VH3 and the via wiring 31C are circular, for example. The diameters of the via hole VH3 and the via wiring 31C may be set to about 50 to 100 μm, for example. Copper or copper alloy may be used as a material of the via wiring 31C, for example.

<Structure of Semiconductor Apparatus>

Figure 6:
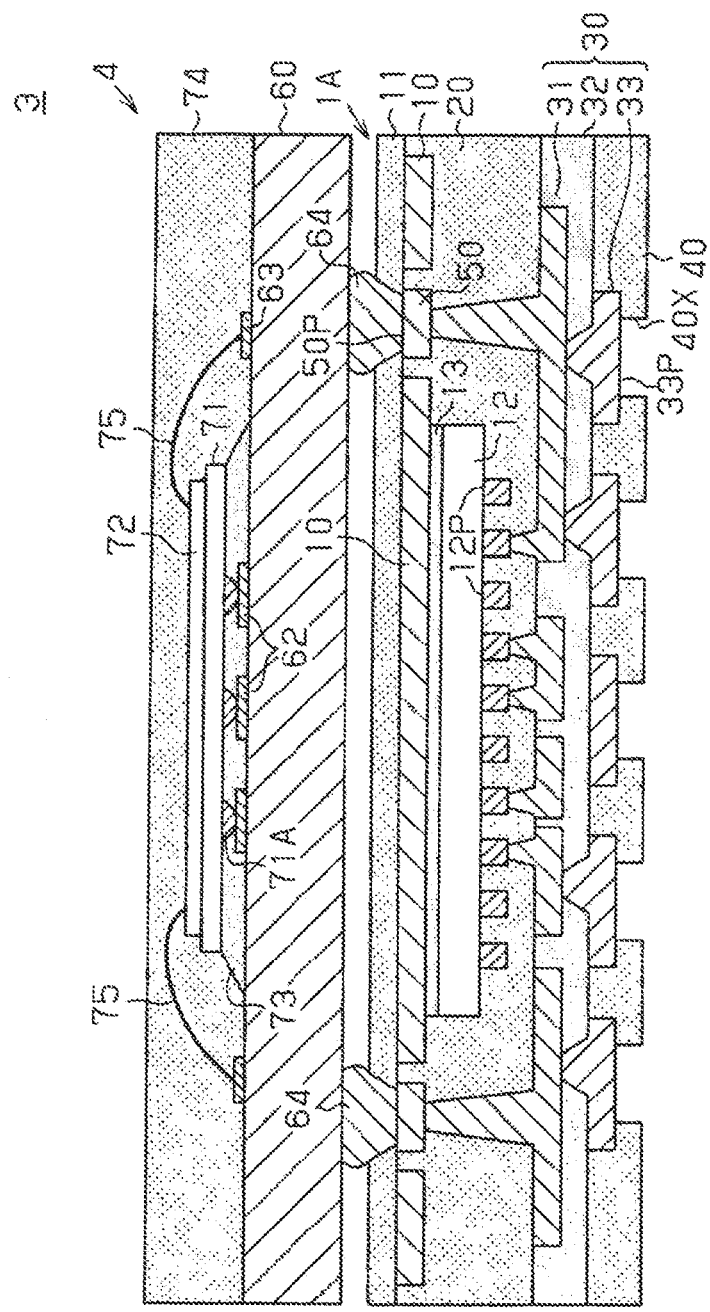
FIG. 6 is a cross-sectional view schematically illustrating the semiconductor package according to the second embodiment.

Next, a structure of a semiconductor apparatus 3 will be described with reference to FIG. 6. In FIG. 6, the semiconductor package 1A is vertically reversed, differently from FIG. 5A.

As shown in FIG. 6, the semiconductor apparatus 3 includes the semiconductor package 1A, and the semiconductor package 4 bonded to the semiconductor package 1.

The semiconductor package 4 includes a wiring substrate 60, a first semiconductor chip 71 that is flip-chip mounted on the wiring substrate 60, and a second semiconductor chip 72 that is bonded onto the first semiconductor chip 71. Further, the semiconductor package 4 includes an under filling resin 73 provided to fill a gap between the first semiconductor chip 71 and the wiring substrate 60, and an encapsulating resin 74 that encapsulates the first semiconductor chip 71, the second semiconductor chip 72 and the like. The planar shape of the first semiconductor chip 71 is formed to be larger in size than the planar shape of the second semiconductor chip 72.

The wiring substrate 60 includes a substrate body 61, a chip pad 62 and a bonding pad 63 formed on an upper surface of the substrate body 61, and an external connection terminal 64 formed on a lower surface of the substrate body 61.

Although not shown, the substrate body 61 is configured by a plurality of insulating layers, and vias, wirings and the like that are formed on the plurality of insulating layers. The vias and wirings provided in the substrate 61 are electrically connected to the chip pad 62, the bonding pad 63 and the external connection terminal 64. As the substrate body 61, for example, a coreless substrate, a core build-up substrate having a core substrate, or the like may be used.

A bump 71A of the first semiconductor chip 71 is flip-chip bonded to the chip pad 62. Further, the bonding pad 63 is electrically connected to an electrode pad (not shown) formed on an upper surface of the second semiconductor chip 72 through a bonding wire 75. As materials of the chip pad 62 and the bonding pad 63, for example, copper or copper alloy may be used. Further, the chip pad 62 and the bonding pad 63 may be formed by applying a metal layer (for example, Au layer, Ni/Au layer, Ni/Pd/Au layer or the like) onto the surface of a copper layer.

The external connection terminal 64 is a connection terminal (for example, solder ball or lead pin) for connection between the semiconductor packages 1 and 4. Each external connection terminal 64 is provided to face each connection pad 50P provided in the semiconductor package 1.

The under filling resin 73 is a resin for improving the connection strength of a connection portion of the bump 71A of the first semiconductor 71 and the chip pad 62, and is provided to fill the gap between the upper surface of the wiring substrate 60 and the lower surface of the first semiconductor chip 71. As a material of the under filling resin 73, for example, an epoxy-based insulating resin may be used.

The encapsulating resin 74 is provided on the upper surface of the substrate body 61 to encapsulate the first semiconductor chip 71, the second semiconductor chip 72, the bonding wire 75 and the bonding pad 63. As a material of the encapsulating resin 74, for example, an insulating resin such as an epoxy-based resin may be used. As a sealing method, for example, a transfer molding method may be used.

Further, in the semiconductor apparatus 3, the external connection terminal 64 formed on the lower surface of the semiconductor package 4 is bonded to the connection pad 50P formed on the upper surface of the semiconductor package 1A. Thus, the semiconductor package 1A and the semiconductor package 4 are bonded to each other, to form the semiconductor apparatus 3 having a POP (Package on Package) structure.

<Method for Manufacturing Semiconductor Package>

Next, a method for manufacturing the semiconductor package 1A will be now described.

First, in a process shown in FIG. 7A, using the same manufacturing processes as those shown in FIGS. 2A to 2C, the first insulating layer 11 and the metal plate 10D are sequentially formed on the support substrate 80. Then, a resist layer 82 having an opening portion 82X is formed on a first surface 10A (upper surface in FIG. 7A) of the metal plate 10D. The opening portion 82X is formed to expose the metal plate 10D other than a portion corresponding to a region where the metal plate 10 and the conductive layer 50 are formed. As a material of the resist layer 82, an etching resistant material may be used. Specifically, as the material of the resist layer 82, a photosensitive dry film resist, a liquid photoresist (for example, a dry film resist or liquid resist such as a novolac-based resin or an acryl based resin), or the like may be used.

Next, by etching the metal plate 10D using the resist layer 82 as an etching mask to remove a portion of the metal plate 10D where the resist layer 82 is not formed, the metal plate 10 and the conductive layer 50 are formed as shown in FIG. 7B. The external dimension of the metal plate 10 is smaller than the external dimension of the first insulating layer 11 according to the above-mentioned patterning, and the metal plate 10 and the conductive layer 50 are electrically separated from each other. After patterning the metal plate 10, the resist layer 82 is removed by an alkaline remover, for example.

Subsequently, in a process shown in FIG. 7C, using the same manufacturing processes as those shown in FIGS. 2F to 3B, an insulating layer 21 that covers the conductive layer 50 is formed on the first insulating layer 11, and an opening portion 21X is formed in the insulating layer 21. Further, the semiconductor chip 12 is bonded to a bonding material 13 in a face-up state on the metal plate 10 exposed through the opening portion 21X of the insulating layer 21. At this time, the insulating layer 21 is formed so that its first surface (upper surface in FIG. 7C) 21A is higher than a circuit forming surface 12A of the semiconductor chip 12.

Then, in a process shown in FIG. 7D, using the same manufacturing processes as those shown in FIGS. 3C and 3D, an insulating layer 22 is formed to cover the first surface 12A and side surfaces of the semiconductor chip 12, and the via holes VH1 and VH3 are formed in the insulating layer 22.

Next, in a process shown in FIG. 8A, a via conductor is filled in the via holes VH1 and VH3 to form the via wirings 31A and 31C, and then, the wiring pattern 31B that is electrically connected to an electrode terminal 12P and the conductive layer 50 through the via wirings 31A and 31C is formed. Thus, the first wiring layer 31 that includes the via wirings 31A and 31C and the wiring pattern 31B is formed. Then, an interlayer insulating layer 32 and a second wiring layer 33 are sequentially formed on the first wiring layer 31, and a solder resist layer 40 having an opening portion 40X for exposing a part of the wiring pattern 33B as an external connection pad 33P is formed.

Next, in a process shown in FIG. 8B, the support substrate 80 (see FIG. 8A) used as a temporary substrate is removed by wet etching or the like. Subsequently, an opening portion 11X is formed in a certain position of the first insulating layer 11 so that a part of the lower surface of the conductive layer 50 is exposed to the outside. The opening portion 11X may be formed by a laser processing method using $CO_2$ laser, UV-YAG laser or the like. In a case where the first insulating layer 11 is formed using a photosensitive resin, for example, the opening portion 11X may be formed by a photolithography process. Thus, a part of the conductive layer 50 is exposed as a connection pad 50P through the opening portion 11X of the insulating layer 11. Also, a surface processing may be performed on the connection pad 50P. For example, a metal layer obtained by sequentially stacking a Ni layer and an Au layer may be formed by an electroless plating process, or a metal layer obtained by sequentially stacking a Ni layer, a Pd layer and an Au layer may be formed.

Then, through cutting process in a region corresponding to the individual semiconductor package 1A, it is possible to obtain the semiconductor package 1A shown in FIG. 8B.

<Method for Manufacturing Semiconductor Apparatus>

Next, a method for manufacturing the semiconductor apparatus 3 will be now described.

Figure 9:
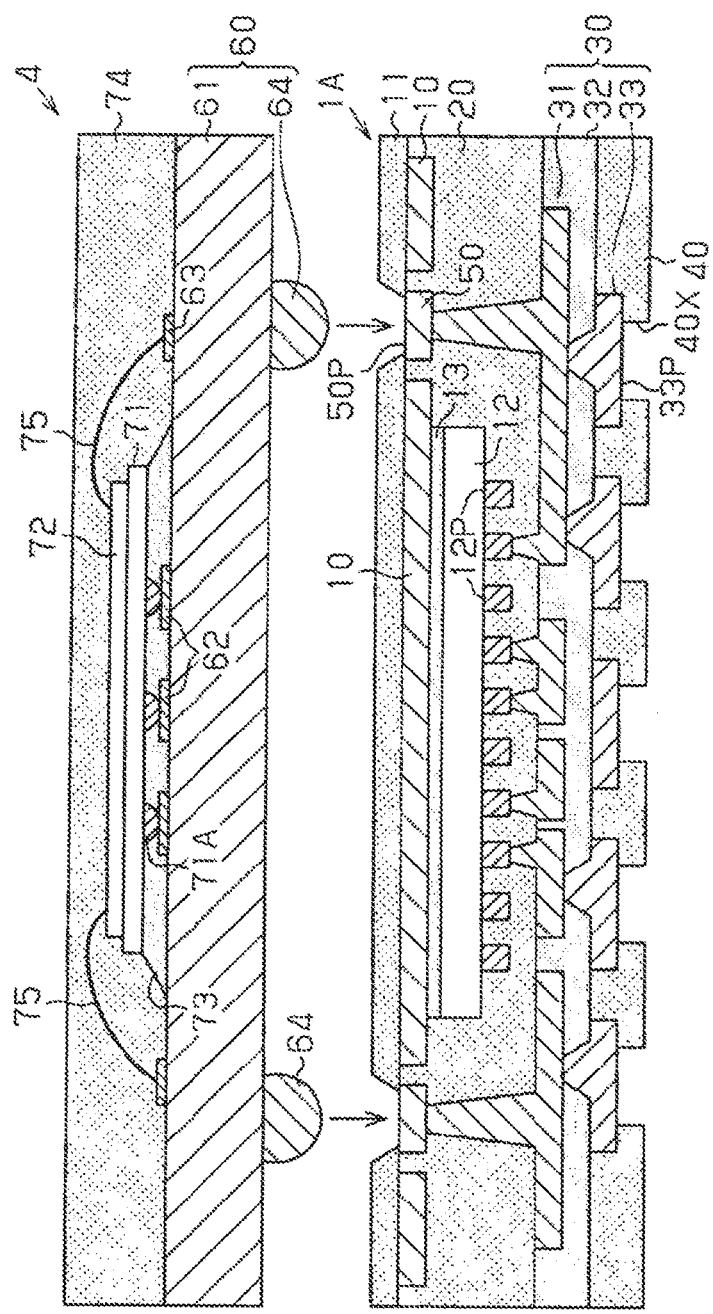
FIG. 9 is a cross-sectional view schematically illustrating a method for manufacturing a semiconductor package according to the second embodiment.
Figure 10:
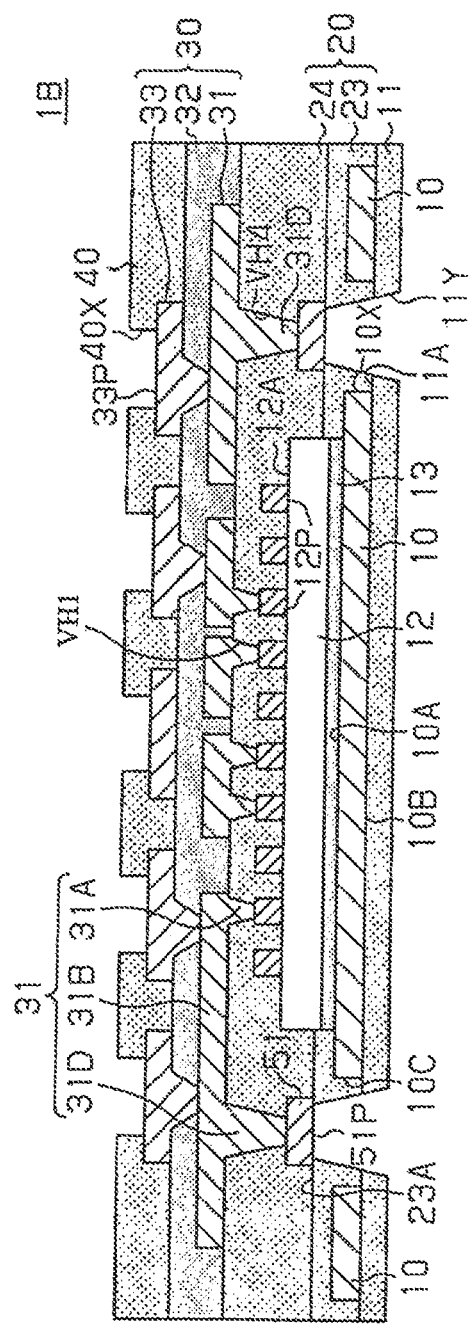
FIG. 10 is a cross-sectional view schematically illustrating the semiconductor package according to a third embodiment.

First, as shown in FIG. 9, the semiconductor package 4 is prepared. Here, although detailed description will be omitted, the semiconductor package 4 is manufactured using the following method, for example. That is, the wiring substrate 60 that includes the chip pad 62, the bonding pad 63 and the external connection terminal 64 is formed, and the bump 71A of the first semiconductor chip 71 is flip-chip bonded to the chip pad 62 formed on the upper surface of the wiring substrate 60. Subsequently, the under-filling resin 73 is formed between the wiring substrate 60 and the first semiconductor chip 71, and then, the second semiconductor chip 72 is bonded onto the first semiconductor chip 71 by a bonding material. Then, the electrode pad (not shown) formed on the upper surface of the second semiconductor chip 72 and the bonding pad 63 formed on the upper surface of the wiring substrate 60 are wire-bonded to each other by the bonding wire 75, and then, the first and second semiconductor chips 71 and 72, the bonding wire 75 and the like may be encapsulated by the encapsulating resin 74.

Subsequently, the semiconductor packages 1A and 4 are positioned so that each connection pad 50P of the semiconductor package 1A faces the external connection terminal 64 of the semiconductor package 4. At this time, a flux (not shown) is transferred to the external connection terminal 64 of the semiconductor package 4.

Then, the semiconductor package 4 that is positioned as described above is mounted on the semiconductor package 1, and then, the structure body is transported to a reflow furnace (not shown). Further, the external connection terminal 64 (here, solder ball) is reflowed in the reflow furnace, and the semiconductor packages 1A and 4 are bonded to each other via the connection pad 50P. Thus, the semiconductor apparatus 3 having the POP structure shown in FIG. 6 is manufactured. At this time, since the semiconductor package 1A is maintained in a flat state, it is possible to easily bond the semiconductor package 4 onto the semiconductor package 1A.

According to the present embodiment as described above, the same effects as those of the first embodiment are obtained.

Third Embodiment

Hereinafter, a third embodiment will be now described with reference to FIGS. 10 to 13. A semiconductor package 1B of the present embodiment is different from the first embodiment in that a connection pad 51P connected to a first wiring layer 31 is provided in an intermediate position in a thickness direction of a second insulating layer 20. Hereinafter, different points from the first embodiment will be mainly described. The same reference numerals are given to the same members as the members shown in FIGS. 1A and 1B to FIG. 9, and detailed description thereof will be omitted.

The second insulating layer 20 includes an insulating layer 23 and an insulating layer 24. As materials of the insulating layers 23 and 24, for example, a thermosetting epoxy-based insulating resin may be used. The insulating resin is not limited to the thermosetting resin, and a photosensitive insulating resin may be used.

The insulating layer 23 is formed to cover a first surface 11A of an insulating layer 11, a first surface 10A and side surfaces 10C of a metal plate 10, and a part of side surfaces of a semiconductor chip 12. The thickness of the insulating layer 23 formed on the first surface 11A of the first insulating layer 11 may be set to about 40 to 70 μm.

A conductive layer 51 is formed on a first surface 23A (upper surface in FIG. 10) of the insulating layer 23. Further, an opening portion 11Y is formed to expose a part of the conductive layer 51 as a connection pad 51P in the insulating layer 23 and the first insulating layer 11. The connection pad 51P is electrically connected to a different semiconductor package 4 (see FIG. 6). The planar shapes of the opening portion 11Y and the connection pad 51P are circular, for example, and their diameters may be set to about 100 to 200 μm, for example. The opening portion 11Y and the connection pad 51P are formed in an annular shape along the periphery of a semiconductor chip 12, in a so-called peripheral shape.

As the conductive layer 51, for example, a layer obtained by stacking a Cu layer or the like on a metal layer obtained by sequentially stacking an Au layer and a Ni layer from the side of the surface exposed from the first insulating layer 11 toward the side of a wiring structure 30 may be used. In this case, the thickness of the Au layer may be set to about 0.1 to 1 μm, for example, the thickness of the Ni layer may be set to about 1 to 10 μm, for example, and thickness of the Cu layer may be set to about 10 to 40 μm, for example.

The insulating layer 24 is formed to cover a part of side surfaces and a first surface 12A of the semiconductor chip 12, and an upper surface and side surfaces of the conductive layer 51. The thickness of the insulating layer 24 formed on a first surface 23A of the insulating layer 23 may be set to about 50 to 100 μm, for example. A via hole VH1 is formed through the insulating layer 24 to expose an upper surface of an electrode terminal 12P, and a via hole VH4 is formed through the insulating layer 24 to expose an upper surface of the conductive layer 51.

The first insulating layer 31 includes a via wiring 31A filled in the via hole VH1, a via wiring 31D filled in the via hole VH4, and a wiring pattern 31B formed on the second insulating layer 20 (insulating layer 24). The via wiring 31D is electrically connected to the conductive layer 51 that is exposed at the bottom of the via hole VH4, and is electrically connected to the wiring pattern 31B. The via hole VH4 and the via wiring 31D are formed in a tapered shape where the diameter is increased from the lower side (the side of the first insulating layer 11) toward the upper side (the side of the second wiring layer 33) in FIG. 10. Further, the planar shapes of the via hole VH4 and the via wiring 31D are circular, for example. The diameters of the via hole VH4 and the via wiring 31D may be set to about 20 to 80 μm, for example. Copper or copper alloy may be used as a material of the via wiring 31D, for example.

The metal plate 10 formed on the first surface 11A of the first insulating layer 11, in a similar way to the metal plate 10 according to the second embodiment, is formed over approximately the entire surface excluding an outer edge of the semiconductor package 1B (for example, the first insulating layer 11), and is formed to extend around the periphery of the conductive layer 51 when viewed from a planar view. Further, in the metal plate 10, an approximately circular opening portion 10X, from a planar view, having a planar shape larger than the conductive layer 51 is formed in a region that faces the conductive layer 51.

<Method for Manufacturing Semiconductor Package>

Next, a method for manufacturing the semiconductor package 1B will be now described.

Figure 11A:
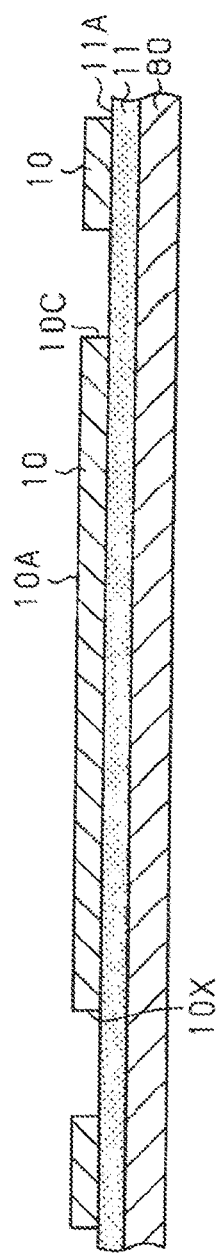
FIG. 11A is a cross-sectional view schematically illustrating a method for manufacturing the semiconductor package according to the third embodiment.
Figure 11B:
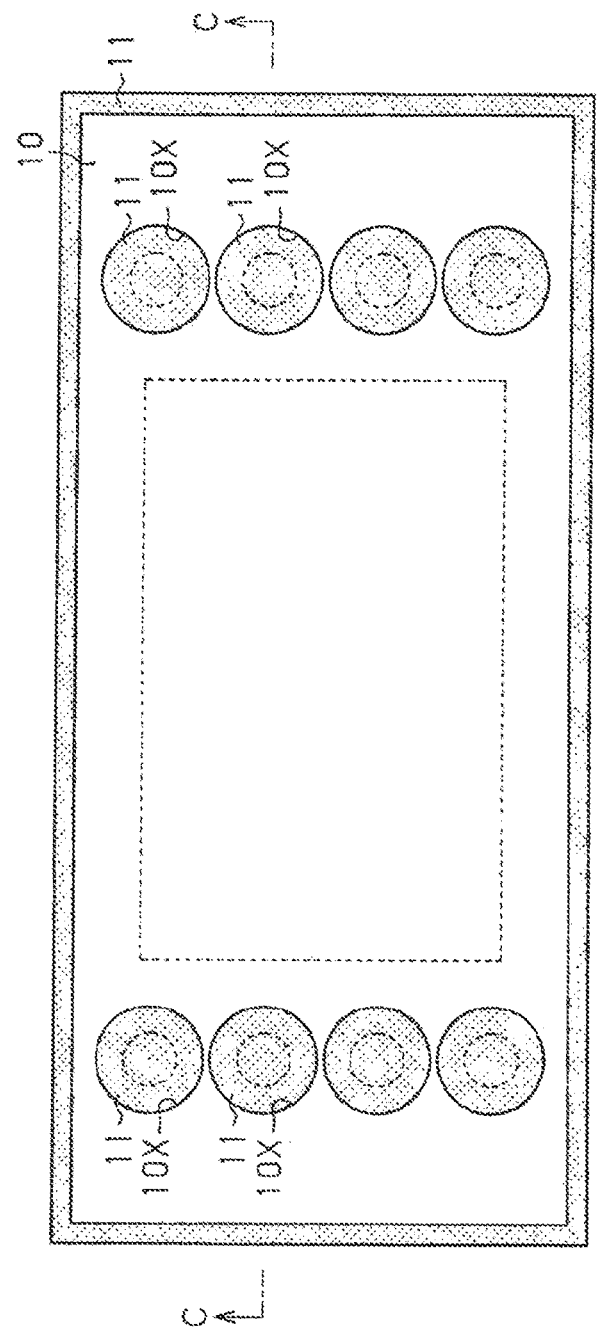

First, in a process shown in FIG. 11A, using the same manufacturing processes as those shown in FIGS. 2A to 2E, the first insulating layer 11 and the metal plate 10D are sequentially formed on the support substrate 80, and the metal plate 10D is patterned to form the metal plate 10 having the opening portion 10X. As shown in FIG. 11B, the metal plate 10 is formed to extend over approximately the entire surface excluding an outer edge of the first insulating layer 11. Further, in the metal plate 10, a plurality of the opening portions 10X are formed outside a region (see a dashed line frame) where the semiconductor chip 12 is mounted in a post-process. In FIG. 11B, a dashed line circle in the opening portion 10X represents a region where the connection pad 51P to be formed in the post-process is formed.

Subsequently, in a process shown in FIG. 12A, the insulating layer 23 is formed to cover the first surface 10A and the side surfaces 10C of the metal plate 10 on the first surface 11A of the first insulating layer 11. For example, the insulating layer 23 may be formed by laminating a resin film on the first surface 11A of the first insulating layer 11 and by performing heat treatment on the resin film at a temperature of about 130° C. to 150° C. while pressing the resin film to be cured.

Then, in a process shown in FIG. 12B, the conductive layer 51 having a predetermined pattern is formed on the first surface 23A of the insulating layer 23 formed in a position that faces the opening portion 10X of the metal plate 10. The conductive layer 51 may be formed using various wiring forming methods such as a semi additive process or a subtractive process.

Subsequently, in a process shown in FIG. 12C, an insulating layer 25 is formed on the first surface 23A of the insulating layer 23 to cover the upper surface and side surfaces of the conductive layer 51. The insulating layer 25 may be formed by laminating a resin film on the first surface 23A of the insulating layer 23 and by performing heat treatment for the resin film at a temperature of about 130° C. to 150° C. while pressing the resin film to be cured.

Figure 13A:
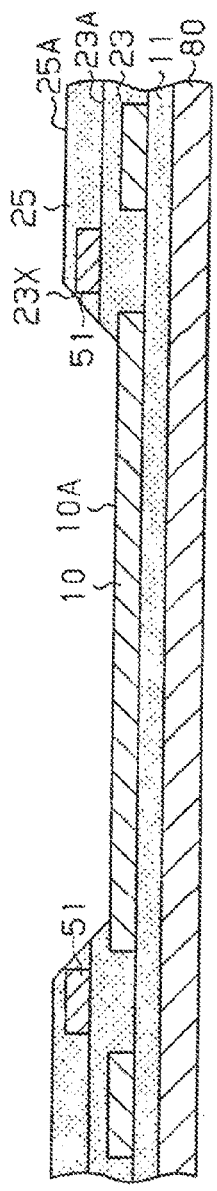
FIGS. 13A to 13C are cross-sectional views schematically illustrating the method for manufacturing the semiconductor package according to the third embodiment.

Then, in a process shown in FIG. 13A, an opening portion 23X is formed through the insulating layer 23 and the insulating layer 25 to expose a portion of the metal plate 10 corresponding to a mounting surface on which the semiconductor chip 12 is mounted. In the present process, the opening portion 23X is formed in a tapered shape where the diameter is increased from the lower side (the side of the metal plate 10) toward the upper side thereof as shown in the figure. The opening portion 23X may be formed by a laser processing method using $CO_2$ laser, UV-YAG laser or the like, or a blasting process such as wet blasting.

Figure 13B:
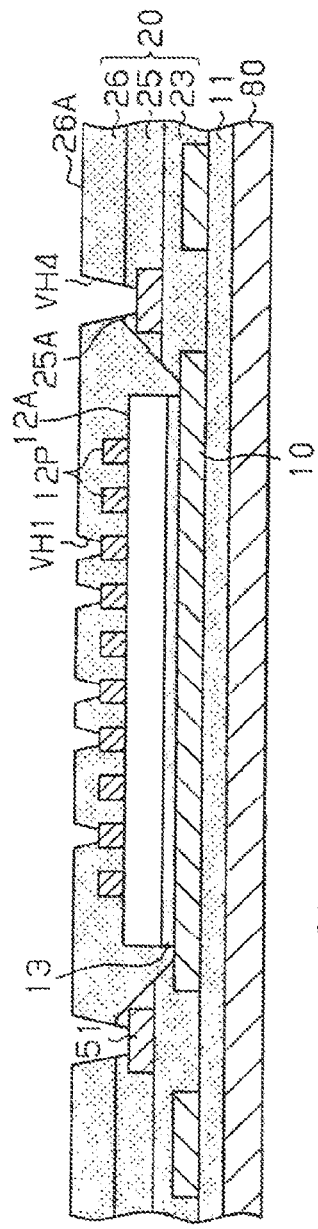

Next, in a process shown in FIG. 13B, the semiconductor chip 12 is bonded onto the metal plate 10 exposed through the opening portion 23X by the bonding material 13 in a face-up state. At this time, the insulating layer 25 is formed so that a first surface (upper surface in FIG. 13B) 25A is formed to be higher than the circuit forming surface 12A of the semiconductor chip 12. Subsequently, using the same manufacturing processes shown in FIGS. 3C and 3D, an insulating layer 26 is formed to cover the first surface 12A and side surfaces of the semiconductor chip 12, and then, via holes VH1 and VH4 are formed in the insulating layer 26.

Figure 13C:
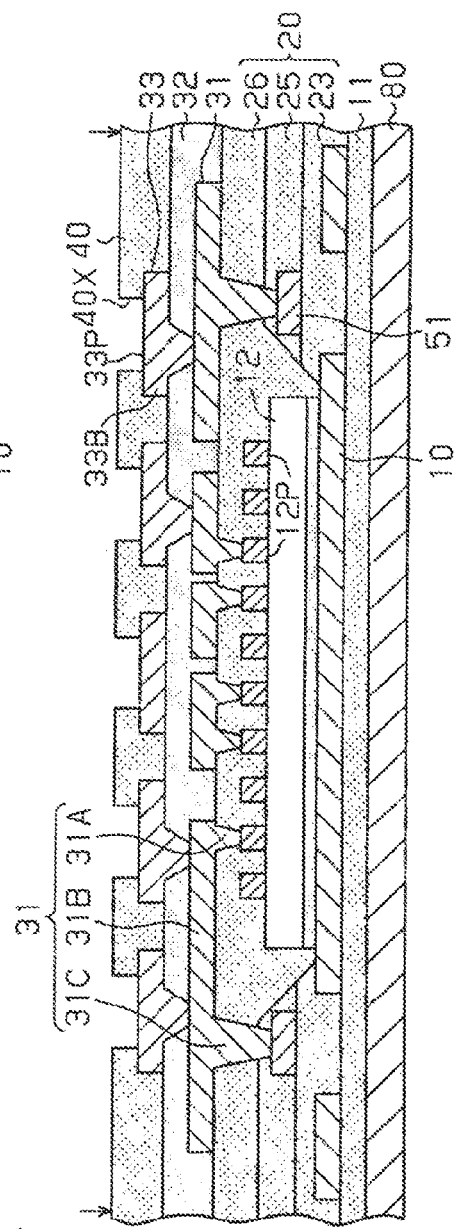

Subsequently, in a process shown in FIG. 13C, via wirings 31A and 31D are formed by filling via conductors in the via holes VH1 and VH4, and a wiring pattern 31B that is electrically connected to the electrode terminal 12P and the conductive layer 51 through the via wirings 31A and 31D is formed. Thus, the first wiring layer 31 that includes the via wirings 31A and 31D and the wiring pattern 31B is formed. Then, the interlayer insulating layer 32 and the second wiring layer 33 are sequentially formed on the first wiring layer 31, and a solder resist layer 40 having an opening portion 40X for exposing a part of a wiring pattern 33B as an external connection pad 33P is formed. Then, using the same manufacturing process as the process shown in FIG. 8B, the support substrate 80 is removed by wet etching or the like, and an opening portion 11Y is formed in a certain place of the first insulating layer 11 and the insulating layer 23 so that a part of the lower surface of the conductive layer 51 is exposed to the outside. Further, through cutting process in a region (indicated by arrow in the figure) corresponding to the individual semiconductor package 1B, it is possible to obtain the semiconductor package 1B shown in FIG. 10.

According to the present embodiment described above, the same effects as those of the first embodiment are obtained.

Other Embodiments

The above respective embodiments may be appropriately changed into the following embodiments.

Figure 14:
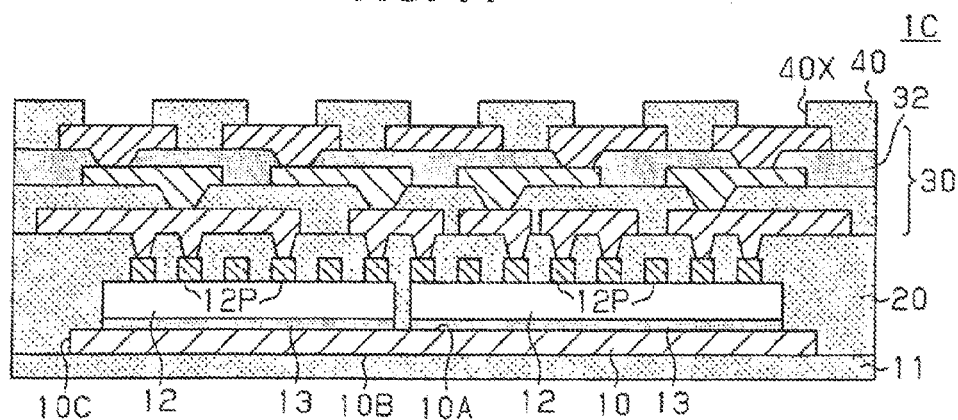
FIG. 14 is a cross-sectional view schematically illustrating a semiconductor package according to a modification example.

In the semiconductor packages 1, 1A and 1B according to the respective embodiments, one semiconductor chip 12 is built-in the semiconductor package. However, this is not limitative, and for example, as shown in FIG. 14, it is possible to realize a semiconductor package 1C in which a plurality of semiconductor chips 12 are built-in. Further, for example, instead of at least one semiconductor chip 12 among the plurality of built-in semiconductor chips 12, an electronic component such as a chip resistor or a chip capacitor may be built-in the semiconductor package. In this case, it is also preferable that the outermost interlayer insulating layer 32 opposite to the first insulating layer 11 among the interlayer insulating layers of the wiring structure 30 be an insulating layer containing a reinforcing material.

In each embodiment, the outermost interlayer insulating layer 32 opposite to the first insulating layer 11 is used as the insulating layer containing the reinforcing material. Further, the thermal expansion coefficient of the interlayer insulating layer 32 is set to be close to the thermal expansion coefficient of the semiconductor chip 12 compared with the thermal expansion coefficients of the first and second insulating layers 11 and 20. However, this is not limitative, and for example, as in a semiconductor package 1D shown in FIG. 15, the outermost interlayer insulating layer 32A opposite to the first insulating layer 11 may be used as an insulating layer without containing a reinforcing material. As a material of the interlayer insulating layer 32A in this case, the same insulating resin as that of the second insulating layer 20 may be used. Specifically, as the material of the interlayer insulating layer 32A, for example, a thermosetting epoxy-based insulating resin may be used. The insulating resin is not limited to the thermosetting resin, and a photosensitive insulating resin may be used.

In each embodiment, the side surfaces of the metal plate 10 are covered by the second insulating layer 20. However, this is not limitative, and for example, the side surfaces of the metal plate 10 may be covered by the first insulating layer 11. In this case, for example, using the manufacturing processes shown in FIGS. 2A to 2E, the insulating layer 11 is formed on the support substrate 80, the metal plate 10 is formed on the first insulating layer 11, and then, the metal plate 10 may be embedded in the first insulating layer 11. For example, after the resist layer 81 is removed from the structure body shown in FIG. 2E, the structure body after removal may be disposed between a pair of press jigs and may be heated and pressurized at a temperature of about 150° C. to 200° C. from the opposite surface sides. Thus, the metal plate 10 is embedded in the first insulating layer 11.

In each embodiment, the insulating layers 21 and 25 (third insulating layer) are formed, the opening portions 21X and 23X are formed in the insulating layers 21 and 25, and then, the semiconductor chip 12 is bonded onto the metal plate 10 exposed through the opening portions 21X and 23X. Further, the insulating layers 22 and 26 (fourth insulating layer) are formed to cover the first surface 12A and the side surfaces of the semiconductor chip 12. However, this is not limitative, and for example, before the second insulating layer 20 (insulating layers 21 to 26) is formed, the semiconductor chip 12 may be bonded onto the metal plate 10, and the second insulating layer 20 may be formed on the first insulating layer 11 to cover the first surface 12A and the side surfaces of the semiconductor chip 12.

In each embodiment, the method for manufacturing a plurality of semiconductor packages is described, but it is possible to realize a method for manufacturing a single semiconductor package. That is, the single semiconductor package 1, 1A or 1B may be manufactured on the support substrate 80.

In each method for manufacturing the semiconductor package 1, 1A or 1B, the semiconductor chip 12 is bonded onto the metal plate 10 formed on one side of the support substrate 80, the wiring layer and the insulating layer are formed on one side of the support substrate 80 by a build-up process, and then, the support substrate 80 is removed to manufacture the semiconductor package 1, 1A or 1B. However, this is not limitative, and for example, the first insulating layers 11 and the metal plates 10 may be formed on the opposite sides of the support substrate 80, and the semiconductor chip 12 may be respectively fixed to the metal plates 10 formed on the opposite sides thereof. Then, the wiring layer and the insulating layer may be respectively formed on the opposite sides of the support substrate 80 by a build-up process, and then, the support substrate 80 may be removed to manufacture the plurality of semiconductor packages 1, 1A and 1B.

In each embodiment, the number of the layers, patterns of the wirings or the like in the semiconductor package 1, 1A or 1B may be variously modified or changed.

In the above-described second embodiment, the number of the semiconductor chips mounted on the wiring substrate 60 of the semiconductor package 4, the mounting type (for example, flip-chip mounting, wire-bonding mounting or combination thereof) of the semiconductor chip, or the like may be variously modified or changed.

EXAMPLES

Next, the above-described embodiments and modification examples will be now described using examples and comparative examples.

Here, with respect to each of semiconductor packages (Example 1 and Example 2) in which a metal plate 10 and a first insulating layer 11 are provided, a semiconductor package (Comparative Example 1) in which the metal plate 10 and the first insulating layer 11 are not provided, and a semiconductor package (Comparative Example 2) in which the first insulating layer 11 is not provided, a temperature dependence evaluation of warpage was performed.

Example 1

A semiconductor package of Example 1 is the semiconductor package 1 shown in FIG. 1. As evaluation conditions, the planar shape of the semiconductor package 1 was set to 8 mm×8 mm, the planar shape of the semiconductor chip 12 was set to 5 mm×5 mm, and the thickness of the semiconductor chip 12 was set to 75 µm. Further, the entire thickness of the semiconductor package 1 was set to 280 µm. Specifically, the thickness of the first insulating layer 11 was set to 25 µm, the thickness of the metal plate 10 was set to 35 µm, and the thickness from the first surface 10A of the metal plate 10 to the first surface 20A of the second insulating layer 20 was set to 140 µm (the thickness from the first surface 10A of the metal plate 10 to the first surface 21A of the insulating layer 21 was set to 95 µm, and the thickness from the first surface 21A of the insulating layer 21 to the first surface 22A of the insulating layer 22 was set to 45 µm). Further, the thicknesses of the wiring patterns 31B and 33B were respectively set to 15 µm, the thickness of the interlayer insulating layer 32 was set to 30 µm, and the thickness of the solder resist layer 40 was set to 20 µm. The height of the electrode terminal 12P was set to 25 µm.

Example 2

Figure 15:
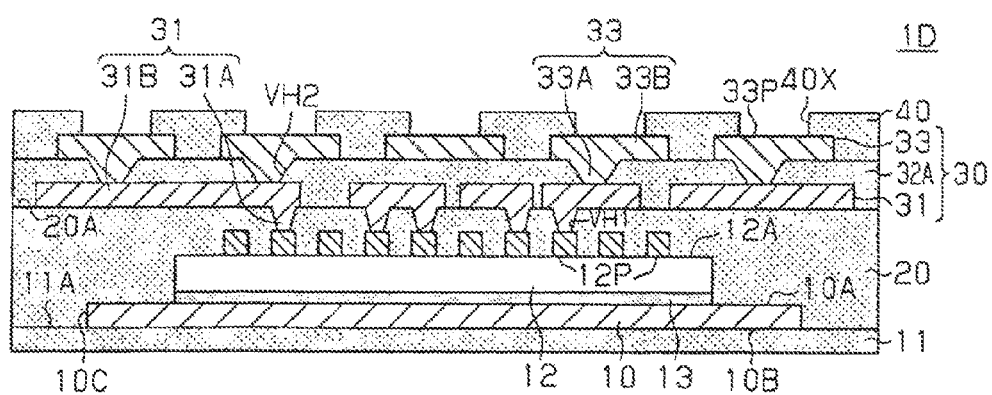
FIG. 15 is a cross-sectional view schematically illustrating a semiconductor package according to a modification example.

A semiconductor package of Example 2 is a semiconductor package 1D shown in FIG. 15, and has a structure in which the outermost insulating layer 32A containing the reinforcing material is removed from the semiconductor package of Example 1. Evaluation conditions are different from Example 1 in that the thickness of the interlayer insulating layer 32A is set to 25 µm.

Comparative Example 1

Figure 16:
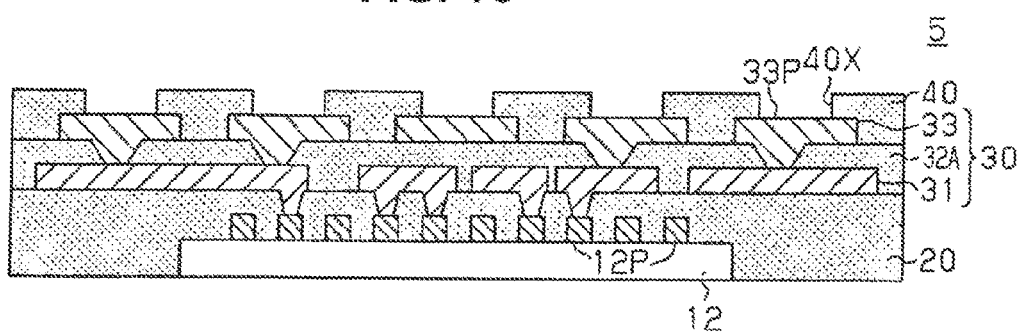
FIG. 16 is a cross-sectional view schematically illustrating a semiconductor package according to a comparative example.

A semiconductor package of Comparative Example 1 is a semiconductor package 5 shown in FIG. 16. The semiconductor package 5 has a structure in which the metal plate 10 and the first insulating layer 11 are removed from the semiconductor package of Example 2, and has the same conditions as those of Example 2, except that the metal plate 10 and the first insulating layer 11 are not provided.

Comparative Example 2

Figure 17:
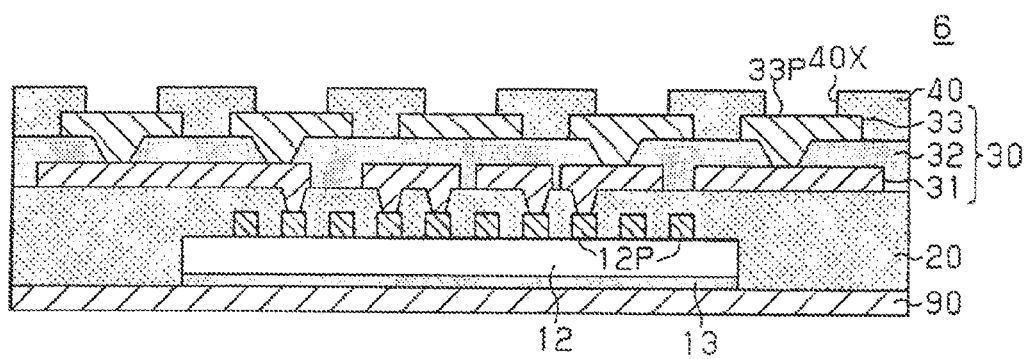
FIG. 17 is a cross-sectional view schematically illustrating a semiconductor package according to a comparative example.

A semiconductor package of Comparative Example 2 is a semiconductor package 6 shown in FIG. 17. The semiconductor package 6 has a structure in which the first insulating layer 11 is removed from the semiconductor package of Example 1 and a metal plate 90 having the same dimension as that of the second insulating layer 20 is formed instead of the metal plate 10. Comparative Example 2 is different from Example 1 only in that the first insulating 11 is not provided and the thickness of the metal plate 90 is set to 35 µm.

<Measurement Method>

With respect to each of the semiconductor packages after the support substrate used in the manufacturing process was removed, warpage when temperature was increased from room temperature to high temperature (here, 260° C.) was measured, and warpage when the temperature was decreased from the high temperature (260° C.) to the room temperature was measured. The measurement of the warpage amount was performed by sequentially measuring the height of a surface (measurement surface) of each semiconductor package in which the external connection pad 33P is formed along a diagonal thereof and measuring the height difference between the highest point and the lowest point. Assume that the warpage amount in a case where the measurement surface is warped in a concave shape is positive and the warpage amount in a case where the measurement surface is warped in a convex shape is negative, the measurement results are shown in FIGS. 18 and 19.

<Measurement Results>

Figure 18:
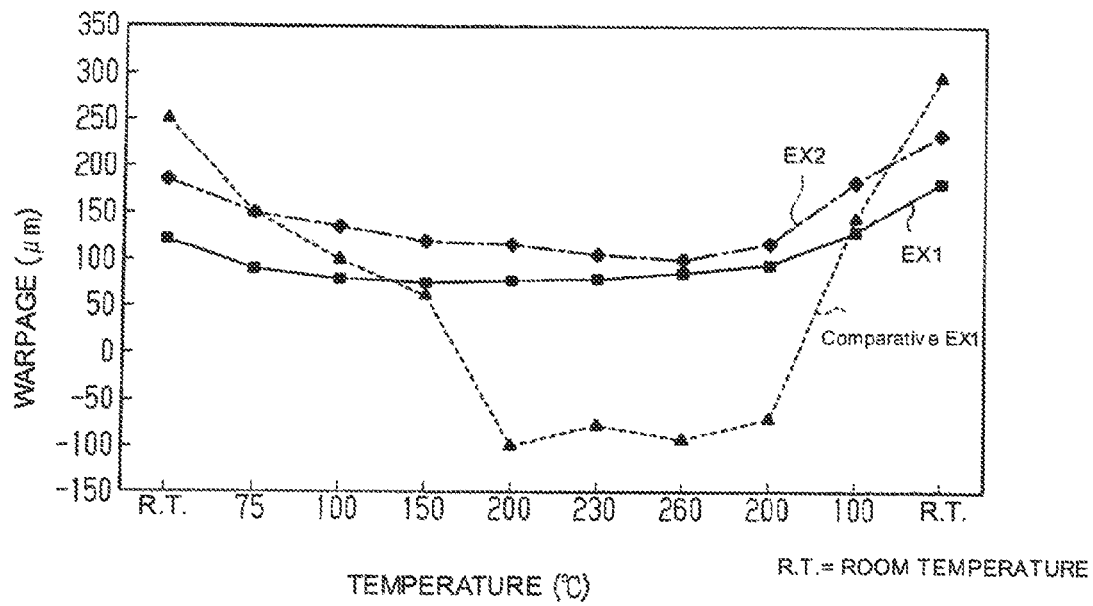
FIG. 18 is a graph illustrating a measurement result obtained by evaluating temperature dependence of the amount of warpage.
Figure 19:
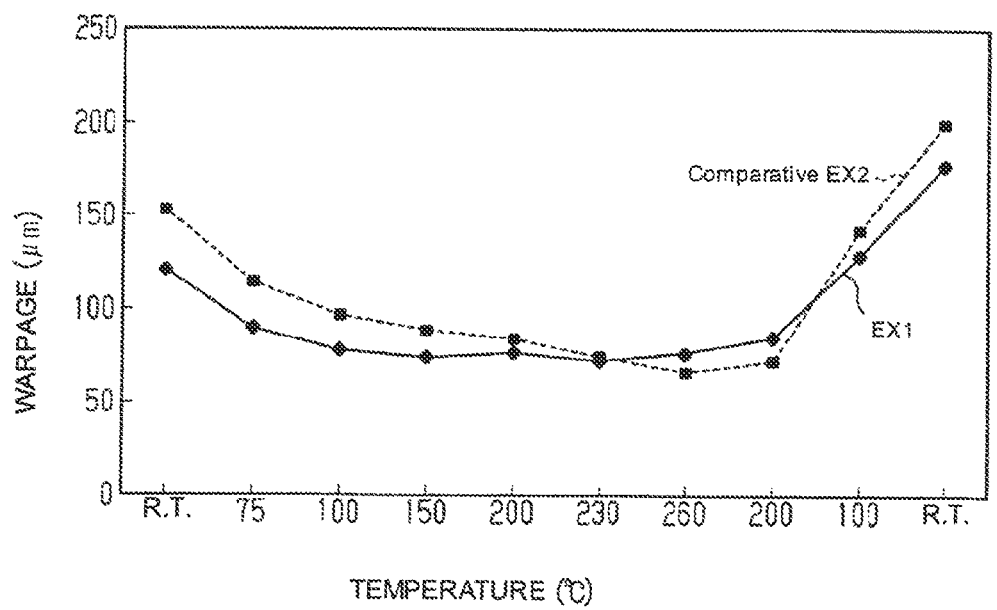
FIG. 19 is a graph illustrating a measurement result obtained by evaluating temperature dependence of the amount of warpage.

As shown in FIG. 18, when comparing Examples 1 and 2 with Comparative Example 1, it is confirmed that it is possible to remarkably reduce the warpage amount of the semiconductor package by providing the metal plate 10 and the first insulating layer 11 (Examples 1 and 2), compared with a case where the metal plate 10 and the first insulating layer 11 are not provided (Comparative Example 1). Specifically, in Examples 1 and 2, compared with Comparative Example 1, it is confirmed that it is possible to remarkably reduce the warpage at the initial room temperature. Further, in Examples 1 and 2, compared with Comparative Example 1, it is confirmed that it is possible to suppress variation of the warpage amount depending on temperature change. Hence, it is confirmed that when the metal plate 10 and the first insulating layer 11 are provided, it is possible to improve warpage reduction effect.

Further, when comparing Example 1 with Example 2, it is confirmed that it is possible to reduce the warpage amount of the semiconductor package by providing the outermost interlayer insulating layer 32 as the insulating layer containing the reinforcing material (Example 1), compared with the case of the interlayer insulating layer 32A that does not contain the reinforcing material (Example 2). That is, it is confirmed that as the outermost interlayer insulating layer 32 is provided as the insulating layer containing the reinforcing material, it is possible to improve a warpage reduction effect.

Further, as shown in FIG. 19, when comparing Example 1 with Comparative Example 2, it is confirmed that it is possible to reduce the warpage amount of the semiconductor package by providing the first insulating layer 11 (Example 1), compared with a case where the first insulating layer is not provided (Comparative Example 2). Specifically, in Example 1, compared with Comparative Example 2, it is confirmed that it is possible to reduce the warpage at the initial room temperature. Further, in Example 1, compared with Comparative Example 2, it is confirmed that it is possible to suppress variation of the warpage amount depending on the temperature change. Hence, it is confirmed that when the metal plate 10 and the first insulating layer 11 are provided, a high warpage reduction improvement effect is achieved.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A semiconductor package comprising:
   a metal plate comprising a first surface, a second surface opposite to the first surface and a side surface between the first surface and the second surface;
   a semiconductor chip comprising a first surface which is formed with an electrode terminal, a second surface opposite to the first surface, and a side surface between the first surface and the second surface, wherein the second surface of the semiconductor chip is directly mounted on the first surface of the metal plate via a bonded material made of an insulating resin;
   a first insulating layer that covers and contacts the second surface of the metal plate;
   a second insulating layer that covers and contacts the first surface and the side surface of the metal plate, and the first surface and the side surface of the semiconductor chip; and
   a wiring structure on the second insulating layer and comprising:
      a wiring layer electrically connected to the semiconductor chip; and
      an interlayer insulating layer on the wiring layer,
   wherein the interlayer insulating layer contains a reinforcing material,
   wherein a thickness of the metal plate is thinner than that of the semiconductor chip, and
   wherein the metal plate is formed on a substantial entirety of a first surface of the first insulating layer except for an outer peripheral edge of the first insulating layer, and
   wherein the metal plate is a flat plate.

2. The semiconductor package of claim 1,
   wherein the interlayer insulating layer is formed of insulating resin containing the reinforcing material, and
   wherein a thermal expansion coefficient of the interlayer insulating layer is closer to that of the semiconductor chip than that of the second insulating layer.

3. The semiconductor package of claim 1, further comprising:
   a conductive layer comprising a first surface and a second surface opposite to the first surface, wherein the first surface of the conductive layer is flush with the first surface of the metal plate, and the second surface of the conductive layer is flush with the second surface of the metal plate,
   wherein the second surface of the conductive layer, which is exposed from the first insulating layer, is configured as a pad to be electrically connected to another semiconductor package, and
   wherein the conductive layer and the metal plate are on the same plane and are separate from each other.

4. The semiconductor package of claim 1, further comprising:
   a conductive layer located between the wiring structure and the metal plate in a thickness direction of the second insulating layer, wherein at least a portion of the conductive layer, which is exposed from the first and second insulating layers, is configured as a pad to be electrically connected to another semiconductor package.

5. The semiconductor package of claim 1, wherein, in the wiring structure, the wiring layer comprises a plurality of wiring layers, and the interlayer insulating layer comprises a plurality of interlayer insulating layers, and
   wherein an outermost one of the interlayer insulating layers is formed of insulating resin containing the reinforcing material, and
   wherein a thermal expansion coefficient of the outermost interlayer insulating layer is closer to that of the semiconductor chip than that of the second insulating layer.

6. A semiconductor apparatus comprising:
   the semiconductor package of claim 3, and
   another semiconductor package on the semiconductor package to be electrically connected to the pad.

7. The semiconductor package of claim 1, wherein
   the semiconductor package defines a surface including an outer peripheral edge, and the metal plate is formed over a substantial entirety of the semiconductor package surface except for the outer peripheral edge,
   an external dimension of the metal plate is smaller than an external dimension of the semiconductor package, and
   the external dimension of the metal plate is larger than an external dimension of the semiconductor chip.

8. The semiconductor package of claim 1, wherein the semiconductor package has a substantially symmetrical distribution of physical properties in a thickness direction around the semiconductor chip.

9. A method for manufacturing a semiconductor package, comprising:
   (a) forming a first insulating layer on a support substrate, wherein the first insulating layer comprises a first surface, a second surface opposite to the first surface, and a side surface between the first surface and the second surface;
   (b) forming a metal plate on a substantial entirety of the first surface of the first insulating layer except for an outer peripheral edge of the first insulating layer, wherein an external dimension of the metal plate is smaller than that of the first insulating layer, and wherein the metal plate is a flat plate;
   (c) bonding a semiconductor chip, comprising a first surface, a second surface opposite to the first surface, and a side surface between the first surface and the second surface, onto a first surface of the metal plate so that the second surface of the semiconductor chip is directly mounted on the first surface of the metal plate via a bonding material made of an insulating resin, and forming a second insulating layer to cover and contact the first surface and the side surface of the metal plate and the first surface and the side surface of the semiconductor chip;
   (d) forming a wiring structure on the second insulating layer, wherein the wiring structure comprises a wiring layer electrically connected to the semiconductor chip, and an interlayer insulating layer on the wiring layer, wherein the interlayer insulating layer contains a reinforcing material;
   (e) removing the support substrate,
   wherein a thickness of the metal plate is thinner than that of the semiconductor chip.

10. A method for manufacturing a semiconductor package, comprising:
- (a) forming a first insulating layer on a support substrate;
- (b) forming a metal plate on the first insulating layer, wherein an external dimension of the metal plate is smaller than that of the first insulating layer;
- (c) bonding a semiconductor chip onto a first surface of the metal plate and forming a second insulating layer to cover the metal plate and the semiconductor chip;
- (d) forming a wiring structure on the second insulating layer, wherein the wiring structure comprises: a wiring layer electrically connected to the semiconductor chip; and an interlayer insulating layer on the wiring layer;
- (e) removing the support substrate, wherein a thickness of the metal plate is thinner than that of the semiconductor chip, wherein step (c) comprises:
- (c1) forming a third insulating layer on the first insulating layer to cover the metal plate;
- (c2) forming an opening portion through the third insulating layer such that the metal plate is exposed through the opening portion;
- (c3) bonding the semiconductor chip onto the first surface of the metal plate which is exposed through the opening portion; and
- (c4) forming a fourth insulating layer to cover the first surface of the metal plate and a first surface of the third insulating layer and to cover a first surface and side surface of the semiconductor chip;

wherein the second insulating layer comprises the third insulating layer and the fourth insulating layer, and wherein in step (c3), the first surface of the third insulating layer is higher than the first surface of the semiconductor chip.

11. The method according to claim 10, wherein in step (c2), a diameter of the opening portion is gradually increased from the metal plate toward the first surface of the third insulating layer.

* * * * *